(12) United States Patent
Tadokoro et al.

(10) Patent No.: US 12,230,936 B2
(45) Date of Patent: Feb. 18, 2025

(54) LASER AMPLIFICATION DEVICE AND EXTREME ULTRAVIOLET LIGHT GENERATION APPARATUS

(71) Applicant: Mitsubishi Electric Corporation, Tokyo (JP)

(72) Inventors: Yuzuru Tadokoro, Tokyo (JP); Tatsuya Yamamoto, Tokyo (JP); Junichi Nishimae, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 447 days.

(21) Appl. No.: 17/792,715

(22) PCT Filed: Mar. 16, 2020

(86) PCT No.: PCT/JP2020/011525
§ 371 (c)(1),
(2) Date: Jul. 14, 2022

(87) PCT Pub. No.: WO2021/186508
PCT Pub. Date: Sep. 23, 2021

(65) Prior Publication Data
US 2023/0051665 A1 Feb. 16, 2023

(51) Int. Cl.
*H01S 3/11* (2023.01)
*H01S 3/00* (2006.01)
(Continued)

(52) U.S. Cl.
CPC .......... *H01S 3/1103* (2013.01); *H01S 3/0014* (2013.01); *H01S 3/0085* (2013.01);
(Continued)

(58) Field of Classification Search
CPC .... H01S 3/1103; H01S 3/0014; H01S 3/0085; H01S 3/094076; H01S 3/2232; H01S 3/2308; H05G 2/008
See application file for complete search history.

(56) References Cited

U.S. PATENT DOCUMENTS

| 2013/0094529 | A1 | 4/2013 | Wakabayashi |
| 2013/0099140 | A1 | 4/2013 | Nakarai et al. |
| 2021/0391683 | A1 | 12/2021 | Tadokoro et al. |

FOREIGN PATENT DOCUMENTS

| JP | 7-335960 A | 12/1995 |
| JP | 2006-505960 A | 2/2006 |

(Continued)

OTHER PUBLICATIONS

International Search Report and Written Opinion mailed on Jun. 16, 2020, received for PCT Application PCT/JP2020/011525, filed on Mar. 16, 2020, 9 pages including English Translation.
(Continued)

*Primary Examiner* — Nicole M Ippolito
*Assistant Examiner* — Hanway Chang
(74) *Attorney, Agent, or Firm* — XSENSUS LLP

(57) ABSTRACT

A laser amplification device includes a laser oscillator that includes a first laser active medium including a mixed gas containing carbon dioxide gas and emits pulsed laser light with the full width at half maximum of between 15 ns to 200 ns, and a laser amplifier that includes a second laser active medium including a mixed gas containing carbon dioxide gas through which the pulsed laser light emitted from the laser oscillator passes to be shortened to pulsed laser light with the full width at half maximum of between 5 ns and 30 ns to be output.

7 Claims, 21 Drawing Sheets

(51) Int. Cl.
   *H01S 3/094*      (2006.01)
   *H01S 3/223*      (2006.01)
   *H01S 3/23*       (2006.01)
   *H05G 2/00*       (2006.01)

(52) U.S. Cl.
   CPC ...... *H01S 3/094076* (2013.01); *H01S 3/2232* (2013.01); *H01S 3/2308* (2013.01); *H05G 2/008* (2013.01)

(56) References Cited

FOREIGN PATENT DOCUMENTS

| | | |
|---|---|---|
| JP | 2006-128157 A | 5/2006 |
| JP | 2011-14913 A | 1/2011 |
| JP | 2012-216768 A | 11/2012 |
| JP | 2012-216769 A | 11/2012 |
| JP | 2013-84971 A | 5/2013 |
| WO | 2004/012308 A2 | 2/2004 |
| WO | 2020/075246 A1 | 4/2020 |

OTHER PUBLICATIONS

Notice of Reasons for Refusal mailed on Sep. 8, 2020, received for JP Application 2020-542335, 8 pages Including English Translation.
Office Action issued Nov. 24, 2023 in Korean Patent Application No. 10-2022-7030269, 10 pages.

LASER AMPLIFICATION DEVICE AND EXTREME ULTRAVIOLET LIGHT GENERATION APPARATUS

CROSS-REFERENCE TO RELATED APPLICATION

The present application is based on PCT filing PCT/JP2020/011525, filed Mar. 16, 2020, the entire contents of which are incorporated herein by reference.

FIELD

The present disclosure relates to a laser amplification device and an extreme ultraviolet light generation apparatus including the laser amplification device.

BACKGROUND

Patent Literature 1 discloses a technique for extending the pulse width of laser light by amplifying pulsed laser light that is output from an oscillation-stage laser device and increases in intensity with time, at an amplification factor decreasing with time.

CITATION LIST

Patent Literature

Patent Literature 1: Japanese Patent Application Laid-open No. 2013-084971

SUMMARY

Technical Problem

Patent Literature 1 has a problem that laser light entering an amplifier has a short pulse width and thus is affected by the rotational relaxation of a laser medium, resulting in a reduction in amplification factor.

The present disclosure has been made in view of the above, and an object thereof is to provide a laser amplification device and an extreme ultraviolet light generation apparatus capable of preventing a reduction in amplification factor and generating high-power extreme ultraviolet light.

Solution to Problem

To solve the problem and achieve the object described above, a laser amplification device according to the present disclosure includes: a laser oscillator including a first laser active medium including a mixed gas containing carbon dioxide gas to emit pulsed laser light with a full width at half maximum of between 15 ns to 200 ns; and a laser amplifier including a second laser active medium including a mixed gas containing carbon dioxide gas through which the pulsed laser light emitted from the laser oscillator passes to be shortened to pulsed laser light with a full width at half maximum of between 5 ns and 30 ns to be output.

Advantageous Effects of Invention

The present disclosure can provide a laser amplification device capable of preventing a reduction in amplification factor in a laser amplifier and generating high-power extreme ultraviolet light.

DESCRIPTION OF EMBODIMENTS

Hereinafter, a laser amplification device and an extreme ultraviolet light generation apparatus according to embodiments of the present disclosure will be described in detail with reference to the drawings.

First Embodiment

Figure 1:
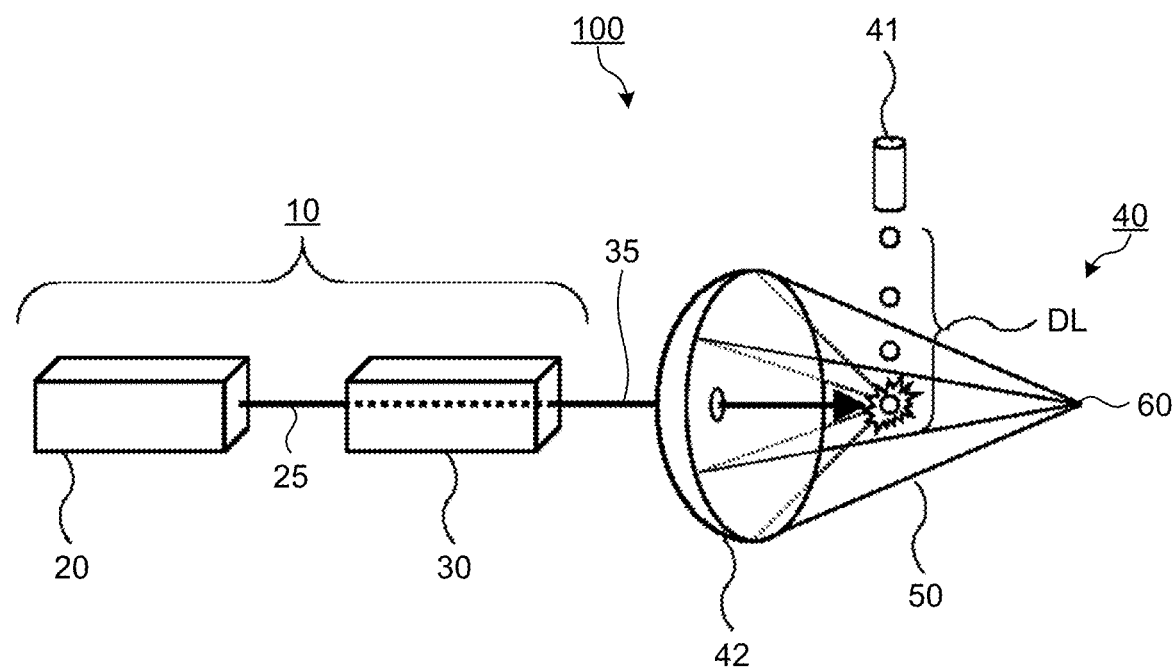
FIG. 1 is a diagram illustrating a configuration of an extreme ultraviolet light generation apparatus including a laser amplification device according to a first embodiment.

FIG. 1 is a diagram illustrating a configuration of an extreme ultraviolet light generation apparatus 100 including a laser amplification device 10 according to a first embodiment. Extreme ultraviolet light is also referred to as EUV light, and the extreme ultraviolet light generation apparatus is also referred to as the EUV light generation apparatus. The EUV light generation apparatus 100 is used as a light source of an exposure apparatus, and generates EUV light with a wavelength of 13.5 nm. The EUV light generation apparatus 100 includes the laser amplification device 10 and an EUV light generator 40.

The laser amplification device 10 is a master oscillator power amplifier (MOPA) laser amplification device. The laser amplification device 10 includes a laser oscillator 20 and a laser amplifier 30. The laser oscillator 20 includes an oscillator including a laser active medium composed of a mixed gas containing carbon dioxide gas ($CO_2$ gas), and generates pulsed laser light 25. The laser amplifier 30 amplifies the pulsed laser light 25 output from the laser oscillator 20 and outputs an amplified pulsed laser light 35 to the EUV light generator 40. The pulsed laser light 25 is also referred to as the incoming laser pulse 25, and the pulsed laser light 35 is also referred to as the outgoing laser pulse 35. Pulsed laser light is also referred to as a laser pulse.

The EUV light generator 40 includes a droplet generator 41 and a collector mirror 42. The collector mirror 42 includes, in a central portion, a transmission part that transmits the pulsed laser light 35 input from the laser amplifier 30. In the EUV light generator 40, droplets DL dropped from the droplet generator 41 are irradiated with the pulsed laser light 35 input from the laser amplifier 30. As the droplets DL, tin (Sn), xenon (Xe), gadolinium (Gd), terbium (Tb), or the like is used. When the droplets DL are irradiated with the pulsed laser light 35, the droplets DL are turned into plasma, and EUV light 50 with a wavelength of 13.5 nm is generated from the droplets DL turned into plasma. The generated EUV light 50 is concentrated into an intermediate focus (IF) point 60 by the collector mirror 42. Although not illustrated in FIG. 1, the EUV light generator 40 also includes a droplet catcher or the like. In the EUV light generator 40, a prepulse may be applied to increase EUV light output.

When the pulse width of the pulsed laser light 35 applied to the droplets DL is about 5 ns to 30 ns, the extreme ultraviolet light generation apparatus 100 has an increased efficiency of conversion into EUV light, providing high-power EUV light. It is desirable for the exposure apparatus to which the extreme ultraviolet light generation apparatus 100 is applied to acquire high-power EUV light exceeding 250 W at the IF point 60. The pulsed laser light 35 exceeding 20 kW is effective for generating high-power EUV light.

Thus, to obtain high-power EUV light, it is desirable for the extreme ultraviolet light generation apparatus 100 to irradiate the droplets DL as targets with the pulsed laser light 35 that has a pulse width of 5 ns to 30 ns and has an output of 20 kW or higher.

Figure 2:
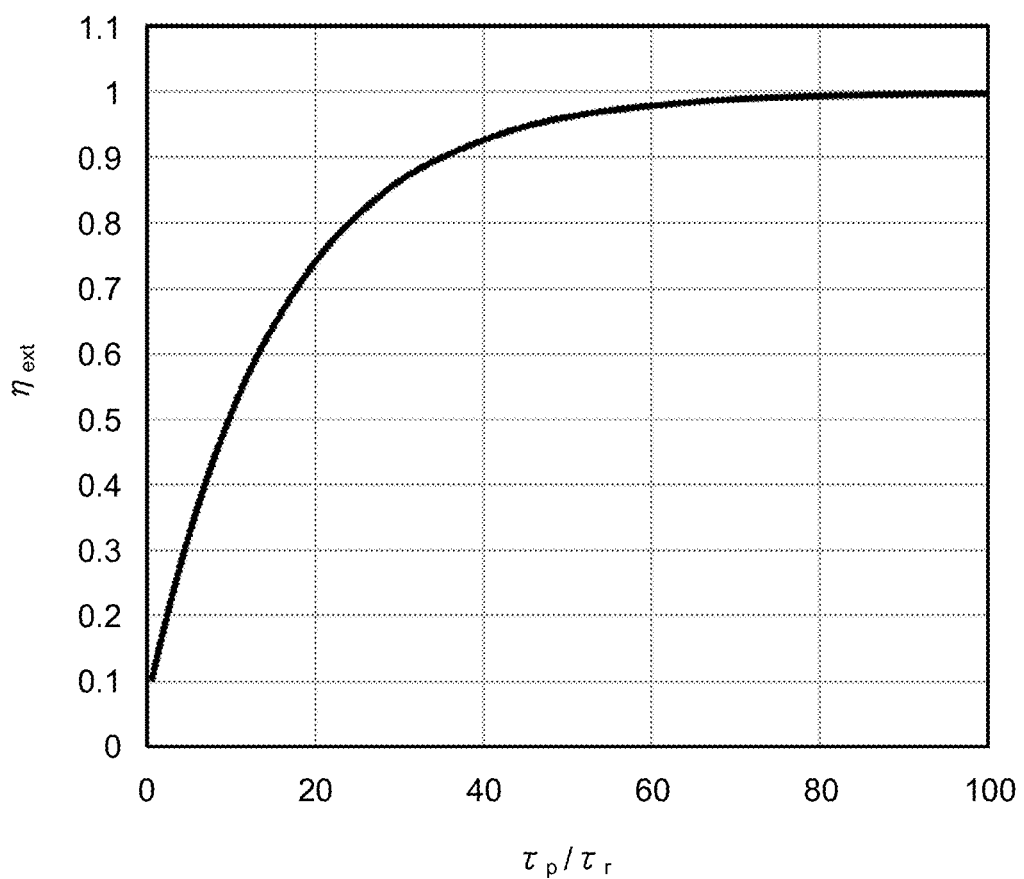
FIG. 2 is a graph illustrating the pulse width-dependent properties of amplification of a laser amplifier in a MOPA $CO_2$ laser.

FIG. 2 illustrates an example of the pulse width-dependent properties of amplification of the laser amplifier 30 in the MOPA $CO_2$ laser. The horizontal axis in FIG. 2 indicates a value $\tau_p/\tau_r$ obtained by dividing the pulse width $\tau_p$ of the pulsed laser light 25 input to the laser amplifier 30 by the rotational relaxation time $\tau_r$ of $CO_2$ molecules. The pulse width $\tau_p$ is represented by the full width at half maximum. The vertical axis in FIG. 2 indicates normalized extracted energy $\eta_{ext}$. The normalized extracted energy $\eta_{ext}$ is a value obtained by dividing extracted energy extracted from the laser amplifier 30 by extracted energy when $\tau_p \gg \tau_r$. Hereinafter, the normalized extracted energy $\eta_{ext}$ is also simply referred to as extracted energy next. $\tau_p \gg \tau_r$ indicates that the pulse width $\tau_p$ of the pulsed laser light 25 is sufficiently larger than the rotational relaxation time $\tau_r$ of $CO_2$ molecules. In the properties of FIG. 2, the fluence $E_{in}$ of the pulsed laser light 25 input to the laser amplifier 30 is sufficiently larger than the saturation fluence $E_s$ of the laser amplifier 30.

FIG. 2 illustrates that the larger the value $\tau_p/\tau_r$, in other words, the longer the pulse width $\tau_p$ of the pulsed laser light 25 input to the laser amplifier 30 is than the rotational relaxation time $\tau_r$, the larger the extracted energy next, and the larger the energy that can be extracted from the laser amplifier 30. At a pressure higher than 20 Torr at which pressure broadening is dominant in the gain spectrum of the active medium of the $CO_2$ laser, the rotational relaxation time $\tau_r$ is typically about some nanoseconds. Thus, as FIG. 2 illustrates, when a laser pulse with the pulse width $\tau_p$ of 5 ns to 30 ns effective for generating high-power EUV light is input to the laser amplifier 30, the extracted energy next does not become nearly equal to 1, and sufficient energy cannot be extracted from the laser amplifier 30. As a result, the amplification factor of the laser amplifier 30 decreases, decreasing the output of EUV light obtained at the IF point 60.

In the first embodiment, by setting the pulse width $\tau_p$ of the pulsed laser light 25 input to the laser amplifier 30 to 15 ns to 200 ns, amplification is performed with the effect of the rotational relaxation of $CO_2$ molecules reduced, increasing the amplified output of the laser amplifier 30.

Figure 3:
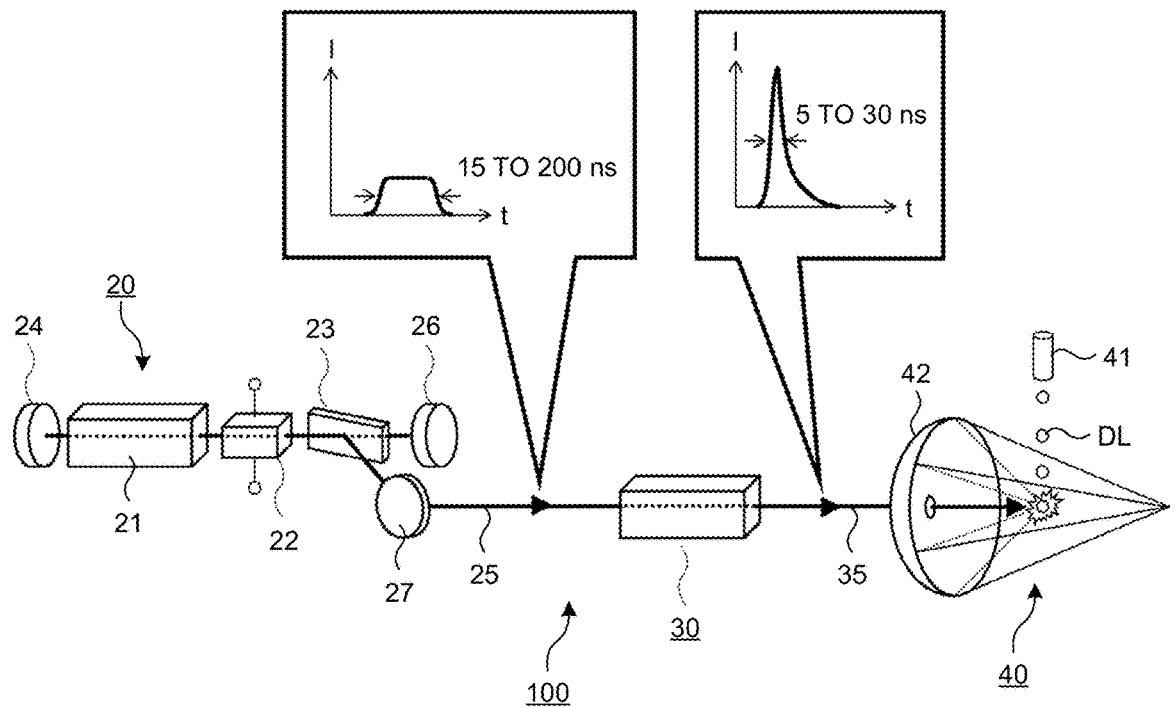
FIG. 3 is a diagram illustrating a detailed configuration of the extreme ultraviolet light generation apparatus including the laser amplification device according to the first embodiment.

FIG. 3 is a diagram illustrating a more detailed configuration example of the extreme ultraviolet light generation apparatus 100 according to the first embodiment. The extreme ultraviolet light generation apparatus 100 includes the laser oscillator 20 that outputs the pulsed laser light 25 having the pulse width $\tau_p$ of 15 ns to 200 ns, the laser amplifier 30 that amplifies the pulsed laser light 25 output from the laser oscillator 20 and outputs the pulsed laser light 35 having a pulse width of 5 ns to 30 ns, and the EUV light generator 40 that irradiates the droplets DL as targets with the pulsed laser light 35 output from the laser amplifier 30 to generate EUV light.

In FIG. 3, the laser oscillator 20 is a Q-switched and cavity-dumped oscillator. The laser oscillator 20 includes a laser active medium 21 that is a mixed gas containing $CO_2$ gas, an electro-optic device 22, a polarization beam splitter 23, a resonator mirror 24, and a resonator mirror 26. Pulsed laser light output from the laser oscillator 20 is transmitted to the laser amplifier 30 by a mirror 27. The laser oscillator 20 constitutes a resonator with the resonator mirror 24 and the resonator mirror 26. The mixed gas containing the $CO_2$ gas may contain gas such as nitrogen ($N_2$), helium (He), carbon monoxide (CO), xenon (Xe), oxygen ($O_2$), and/or hydrogen ($H_2$) in addition to the $CO_2$ gas. The laser oscillator 20 modulates a voltage applied to the electro-optic device 22 at a high-repetition frequency of, for example, 5 kHz or higher, thereby generating the pulsed laser light 25 having the pulse width $\tau_p$ of 15 ns to 200 ns by Q-switched and cavity-dumped oscillation. Although FIG. 3 illustrates an example in which the laser oscillator 20 performs Q-switched and cavity-dumped oscillation, other pulse oscillation such as Q-switched oscillation may be used. The laser oscillator 20 may be a pulsed laser oscillator such as a quantum cascade laser that can oscillate at the oscillation wavelength of the $CO_2$ laser. Although the electro-optic device 22 is used in FIG. 3, an acousto-optic device may be used to generate the pulsed laser light 25 having a pulse width of 15 ns to 200 ns.

The laser amplifier 30 is an amplifier including a mixed gas containing $CO_2$ gas as an amplification active medium. Although FIG. 3 illustrates the laser amplifier 30 as a single-stage amplifier, a multi-stage laser amplifier in which two or more amplifiers are arranged may be used. The beam diameter of pulsed laser light may be adjusted by a lens, a mirror, or the like in the laser amplifier 30 to maximize amplified output by the laser amplifier 30. The pulsed laser light 25 having the pulse width $\tau_p$ of 15 ns to 200 ns input to the laser amplifier 30 is amplified by the laser amplifier 30 and is output as the pulsed laser light 35 having a pulse width of 5 ns to 30 ns.

As illustrated in FIG. 1, the EUV light generator 40 includes the droplet generator 41 and the collector mirror 42.

In the configuration according to the first embodiment, the pulse width $\tau_p$ of the pulsed laser light 25 input to the laser amplifier 30 is set to 15 ns to 200 ns, so that amplification can be performed with the effect of the rotational relaxation of $CO_2$ molecules reduced, and the amplified output of the laser amplifier 30 can be increased. For the sake of explanation, the following advances the description with the rotational relaxation time $\tau_r$ as 1.5 ns, but is not intended to limit the rotational relaxation time $\tau_r$.

Figure 4:
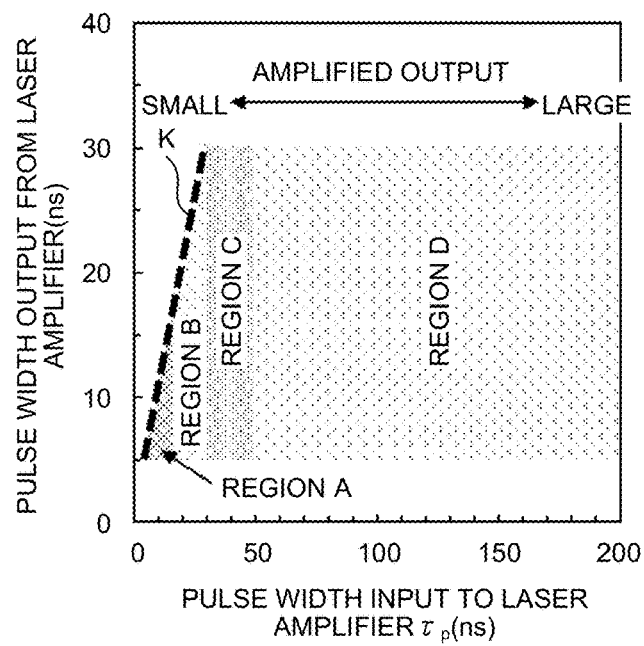
FIG. 4 is a diagram illustrating a relationship between the pulse width of pulsed laser light input to the laser amplifier and the pulse width of pulsed laser light output from the laser amplifier.

FIG. 4 is a diagram illustrating a relationship between the pulse width $\tau_p$ of the pulsed laser light 25 input to the laser amplifier 30 and the pulse width of the pulsed laser light 35 output from the laser amplifier 30. In FIG. 4, the vertical axis represents the pulse width (ns) of the outgoing laser pulse 35, and the horizontal axis represents the pulse width $\tau_p$ of the incoming laser pulse 25. As described above, when the pulse width of the outgoing laser pulse 35 is 5 ns to 30 ns, the EUV light generator 40 is increased in the efficiency of conversion into EUV light. In FIG. 4, the region where the pulse width of the outgoing laser pulse 35 is 5 ns to 30 ns, with which the efficiency of conversion into EUV light is increased, is divided into four regions including a region A, a region B, a region C, and a region D, based on the value of the normalized extracted energy $\eta_{ext}$ when the rotational relaxation time $\tau_r$ is 1.5 ns.

The region A is the region where the pulse width $\tau_p$ of the incoming laser pulse 25 is 5 ns to 15 ns, and is the region where the normalized extracted energy $\eta_{ext}$<0.5 as illustrated in FIG. 2.

The region B is the region where the pulse width $\tau_p$ of the incoming laser pulse 25 is 15 ns to 30 ns, and is the region where 0.5<$\eta_{ext}$<0.75 as illustrated in FIG. 2.

The region C is the region where the pulse width $\tau_p$ of the incoming laser pulse 25 is 30 ns to 50 ns, and is the region where 0.75<$\eta_{ext}$<0.9 as illustrated in FIG. 2.

The region D is the region where the pulse width $\tau_p$ of the incoming laser pulse 25 is 50 ns to 200 ns, and is the region where $\eta_{ext}$>0.9 as illustrated in FIG. 2.

Thus, the output of the laser amplifier 30 becomes higher as located toward the right side in FIG. 4. The decreasing order of amplified output is the region D, the region C, the region B, and the region A.

In a typical amplification operation, the pulse width of pulsed laser light input to a laser amplifier and the pulse width of pulsed laser light output from the laser amplifier do not greatly change, and thus the pulse width of the pulsed laser light input to the laser amplifier in this case is 5 ns to 30 ns. That is, it can be understood that the typical amplification operation is performed on a broken line K in FIG. 4.

In contrast, in the first embodiment, since the pulse width of the pulsed laser light 25 input to the laser amplifier 30 is 15 ns to 200 ns, it can be understood that the amplification operation is performed in one of the region B, the region C, and the region D. Since the region B, the region C, and the region D are regions located on the right side of the broken line K, the first embodiment can provide an amplified output higher than the output obtained by the typical amplification operation. Hereinafter, the pulse width $\tau_p$ of the pulsed laser light 25 input to the laser amplifier 30 is referred to as the incoming pulse width $\tau_p$.

In the first embodiment, in the region C and the region D where the incoming pulse width $\tau_p$ is 30 ns to 200 ns, the extracted energy $\eta_{ext}$>0.75. In the typical amplification operation, which is performed on the broken line K in FIG. 4, the extracted energy $\eta_{ext}$ does not exceed 0.75 since the broken line K is part of the region A and the region B. Thus, when the incoming pulse width $\tau_p$ is 30 ns to 200 ns, an amplified output higher than the output obtained by the typical amplification operation can be obtained.

In the first embodiment, in the region D where the incoming pulse width $\tau_p$ is 50 ns to 200 ns, the extracted energy $\eta_{ext}$>0.9. Thus, when the incoming pulse width $\tau_p$ is 50 ns to 200 ns, an amplified output higher than the output obtained by the typical amplification operation can be obtained. In addition, as illustrated in FIG. 2, in this region, the extracted energy $\eta_{ext}$ is saturated for the incoming pulse width $\tau_p$, and a change in the amplified output becomes smaller relative to a change in the incoming pulse width $\tau_p$. Therefore, this region is characterized in that the amplification factor is less likely to decrease even when pulse shortening during amplification as described below occurs. Thus, in the region where the incoming pulse width $\tau_p$ is 50 ns to 200 ns, it is possible to perform amplification while minimizing a decrease in the amplification factor.

The incoming pulse width $\tau_p$ may be set to 15 ns or more with which the extracted energy $\eta_{ext}$>0.5. The incoming pulse width $\tau_p$ may be desirably set to 20 ns or more with which the extracted energy $\eta_{ext}$>0.6. The incoming pulse width $\tau_p$ may be more desirably set to 30 ns or more with which the extracted energy $\eta_{ext}$>0.75. The incoming pulse width $\tau_p$ may be more desirably set to 40 ns or more with which the extracted energy $\eta_{ext}$>0.8. The incoming pulse width $\tau_p$ may be more desirably set to 50 ns or more with which the extracted energy $\eta_{ext}$>0.9.

As illustrated in FIG. 2, when the incoming pulse width $\tau_p$ is 200 ns or more, the extracted energy next is nearly equal to 1. In this region, even if the incoming pulse width $\tau_p$ is made longer, the value of the extracted energy next does not increase, and a large increase in amplified output cannot be obtained. In addition, the longer the incoming pulse width $\tau_p$, the more the peak value of the pulsed laser light 35 output from the laser amplifier 30 decreases. Thus, to prevent a decrease in laser pulse peak value and obtain high amplified output, the incoming pulse width $\tau_p$ may be desirably set to 200 ns or less. Details of a decrease in laser pulse peak value will be described later.

Figure 5:
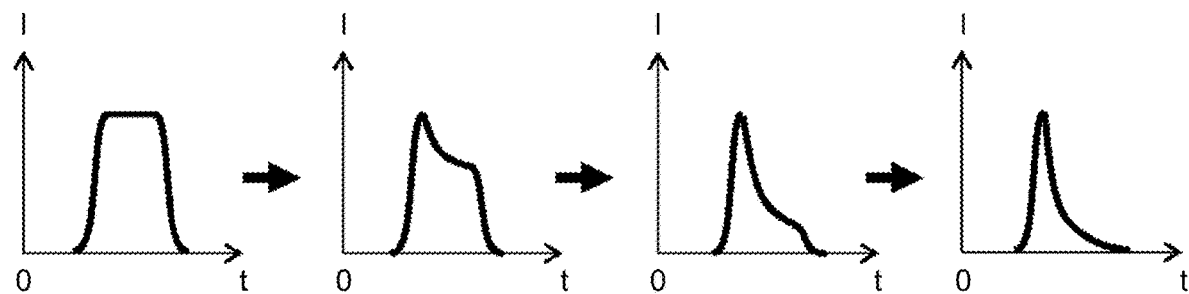
FIG. 5 is a diagram illustrating a pulse shape changing process when a super-Gaussian-shaped laser pulse is amplified.

Next, the pulse shortening effect of a pulse shape change during amplification in the laser amplifier 30 will be described. FIG. 5 illustrates an example of a pulse shape changing process when a super-Gaussian-shaped laser pulse is amplified. Here, attention is paid only to changes in pulse shape, and thus the maximum values of pulse shapes on the vertical axes illustrated in FIG. 5 are made equal. In actuality, however, the maximum value on the vertical axis increases as amplification proceeds. The horizontal axes t represent time, and the vertical axes I represent intensity. Hereinafter, t is used as a symbol indicating time, and I intensity. When a laser pulse is input to the laser amplifier 30, a front portion of the laser pulse first consumes energy stored in the amplification medium. Consequently, the amplification factor of a rear portion of the laser pulse amplified by the remaining energy is lower than the amplification factor of the front portion of the laser pulse. Here, the front portion of the laser pulse refers to a portion entering the laser amplifier 30 first, and refers to portions of the laser pulse shapes in FIG. 5 closer to t=0. Since the front portion of the laser pulse consumes energy stored in the laser amplifier 30 first, the laser pulse is sharpened as the amplification proceeds as illustrated in FIG. 5, resulting in the outgoing laser pulse 35 with a shorter pulse width than the incoming laser pulse 25.

Figure 6:
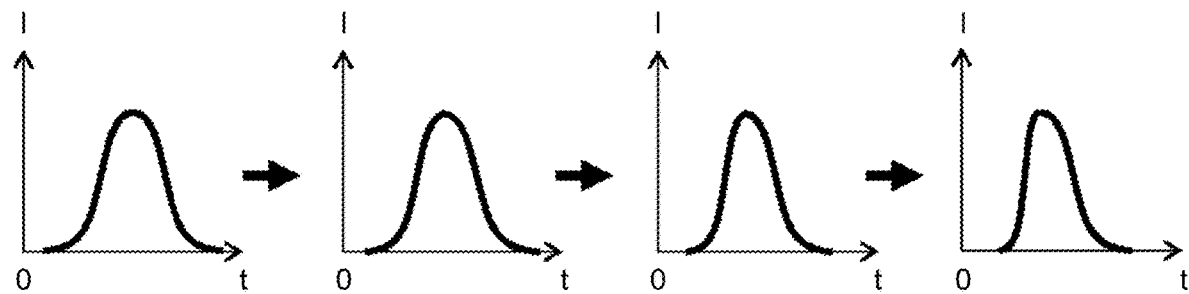
FIG. 6 is a diagram illustrating a pulse shape changing process when a Gaussian-shaped laser pulse is amplified.

By contrast, FIG. 6 is a diagram illustrating an example of a pulse shape changing process during amplification when the incoming laser pulse 25 has a typical Gaussian-shaped waveform. In the Gaussian shape, the energy consumption of the laser pulse front portion is smaller than that in the super-Gaussian shape, and thus sharpening of the laser pulse is less likely to occur. As a result, a laser pulse shortening effect like that obtained when the super-Gaussian shape is input cannot be obtained.

As described above, when the super-Gaussian-shaped pulse shape is used as the incoming laser pulse 25, by inputting the pulsed laser light 25 having a pulse width of 15 ns to 200 ns output from the laser oscillator 20 to the laser amplifier 30 for amplification, the pulsed laser light 35 with a pulse width of 5 ns to 30 ns can be output.

Figure 7:
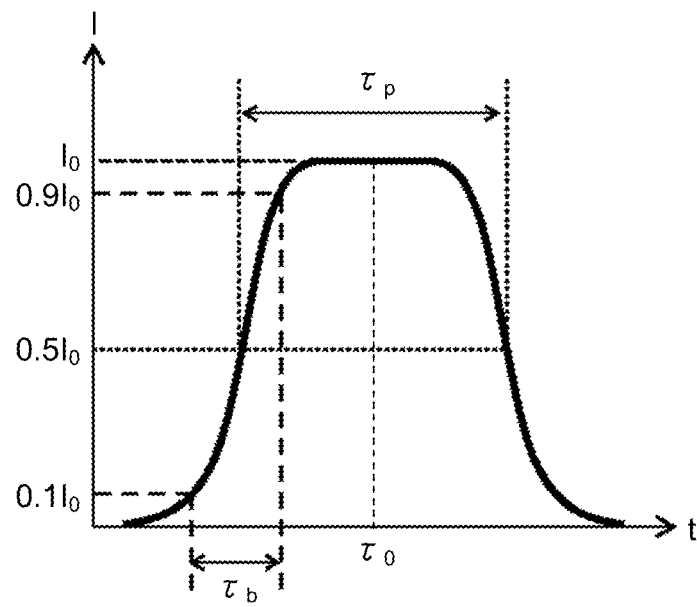
FIG. 7 is a diagram illustrating an example of the shape of the super-Gaussian-shaped laser pulse.

FIG. 7 illustrates an example of the shape of the super-Gaussian-shaped laser pulse. When the time $t=t_0$ is the center of symmetry, $I_0$ is a maximum intensity, $\tau_p$ is the full width at half maximum, and P is a coefficient, a super-Gaussian function $I_{sg}(t)$ can be expressed as formula (1) as a function of the time t.

[Formula 1]

$$I_{sg}(t) = I_0 \exp\left\{-\left[4\sqrt[P]{\ln 2}\,\frac{(t-t_0)^2}{\tau_p^2}\right]^P\right\} \tag{1}$$

Figure 8:
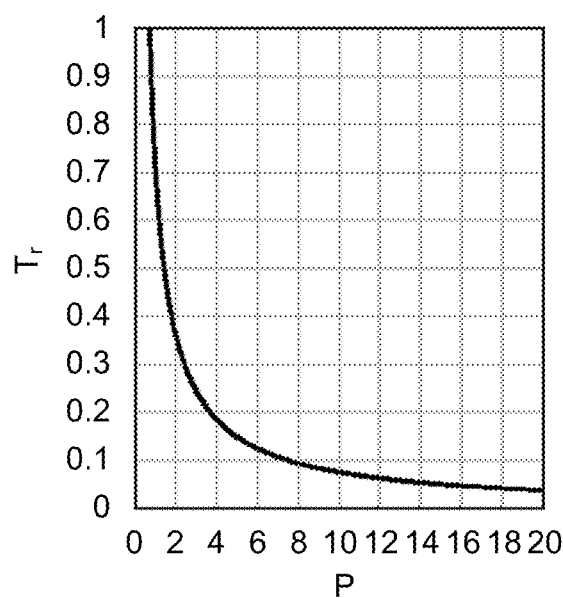
FIG. 8 is a graph illustrating a relationship between a ratio $T_r$ and a coefficient P.

In formula (1), when the coefficient P is 1, the super-Gaussian function agrees with a Gaussian function. As illustrated in FIG. 7, a rise time $\tau_b$ is defined as a time until the intensity I reaches 0.9 $I_0$ from 0.1 $I_0$. In other words, in a pulse time waveform, the time from when the intensity I increases to 10% intensity of the maximum intensity of pulsed light to when the intensity I increases to 90% intensity of the maximum intensity is referred to as the rise time $\tau_b$. Likewise, the time from when the intensity I decreases to 90% of the maximum intensity of pulsed light to when the intensity I decreases to 10% of the maximum intensity is referred to as a fall time. When the ratio between the full width at half maximum $\tau_p$ of the super-Gaussian shape and the rise time $\tau_b$ is $\tau_r=\tau_b/\tau_p$, the relationship between the ratio $\tau_r$ and the coefficient P is as illustrated in FIG. 8. That is, the ratio $\tau_r$ decreases as the coefficient P increases. For example, when the ratio $\tau_r$ is close to 0.72, the coefficient P is close to 1, which means a Gaussian shape. When the ratio $\tau_r$ is close to 0.35, it means that the pulse shape is a super-Gaussian shape with P=2. When the ratio $\tau_r$<<0.72, P is a value sufficiently larger than 1, which means that the pulse shape is a shape close to a rectangular shape.

When the incoming laser pulse 25 has any shape other than super-Gaussian, for example, even when the incoming laser pulse 25 is an asymmetric laser pulse whose rise time and fall time are different, $\tau_r$ is also defined as the ratio between the full width at half maximum $\tau_p$ and the rise time $\tau_b$ ($\tau_r=\tau_b/\tau_p$). In the description of the present disclosure, a super-Gaussian shape whose rise time and fall time are equal is used in the description, which is not intended to limit the pulse shape. Even with a pulse shape of an arbitrary shape such as that of an asymmetric laser pulse, the same effect as that of a symmetric pulse can be obtained.

As illustrated in FIG. 6, for a shape close to a Gaussian shape with the ratio $\tau_r$ close to 0.72, a remarkable pulse shortening effect cannot be obtained. For a shape close to a super-Gaussian shape with the ratio $\tau_r$ smaller than 0.72, a remarkable pulse shortening effect can be obtained. As the ratio $\tau_r$ decreases, the pulse shape approaches a rectangular shape, and a greater pulse shortening effect is obtained.

Figure 9:
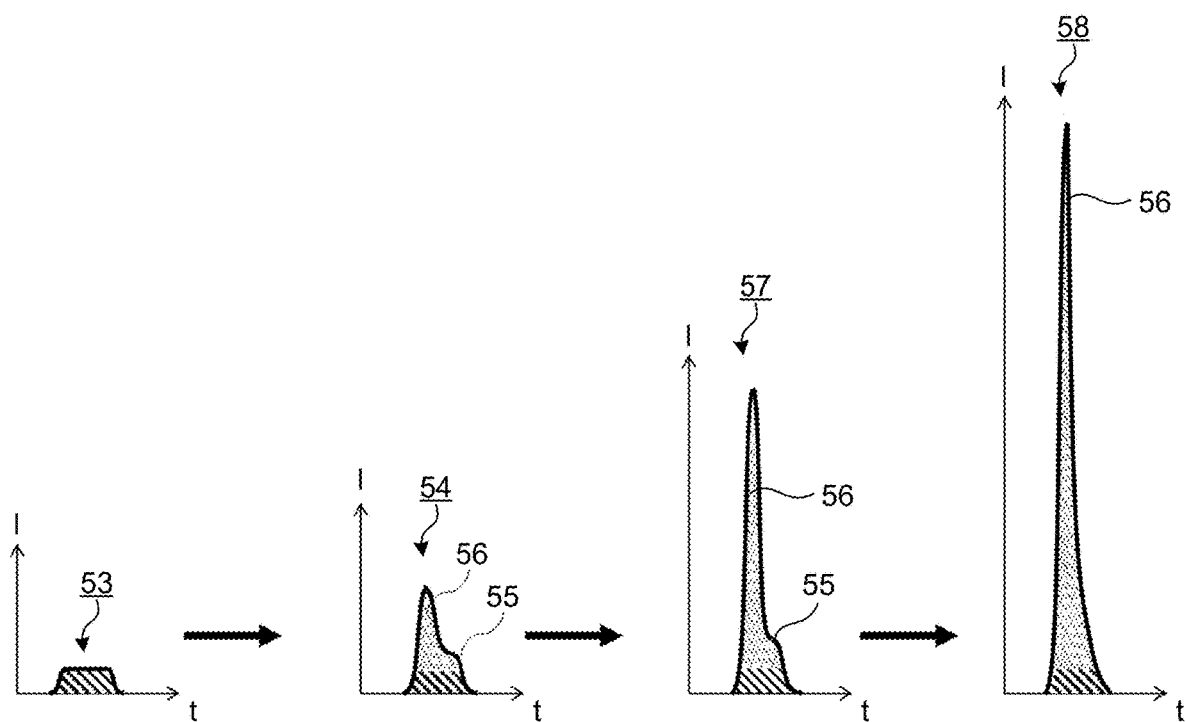
FIG. 9 is a diagram illustrating changes in pulse shape and intensity in a process of amplifying a laser pulse.

A change in pulse shape resulting in pulse shortening is more obvious when the extracted energy of the laser amplifier 30 relative to the incoming laser pulse 25 is larger, in other words, when the amplification factor of the laser amplifier 30 is larger. FIG. 9 illustrates an example of changes in pulse shape and changes in pulse intensity in a pulse amplification process. In FIG. 9, when the extracted energy from the laser amplifier 30 relative to the incoming laser pulse 25 is small, for example, when a laser pulse 53 illustrated on the left side in FIG. 9 enters the laser amplifier 30 to be amplified, a post pedestal 55 remains in the pulse shape as in a laser pulse 54 illustrated second from the left in FIG. 9 or a laser pulse 57 illustrated in the third diagram from the left in FIG. 9. The post pedestal 55 refers to a pedestal-shaped portion appearing behind a main pulse 56. This is because, in the laser pulse 54 or the laser pulse 57, the main pulse 56, which is an energy portion extracted from the laser amplifier 30, is small, and the contribution of an energy portion of the incoming laser pulse 53 is large. In contrast, when the amplification factor of the laser amplifier 30 is high, the main pulse 56, which is an energy portion extracted from the laser amplifier 30, is large as in a laser pulse 58 illustrated in the fourth diagram from the left in FIG. 9, so that a pulse shape without the post pedestal 55 can be obtained.

The amplification factor of the laser amplifier 30 is desirably 1000 times or more to obtain EUV light exceeding 250 W in the EUV light generator 40. The reason will be described below. When an EUV light output output from the extreme ultraviolet light generation apparatus 100 is larger than 250 W, the number of wafers that can be processed by the exposure apparatus per hour is larger than 125 suitable for mass production. Thus, by making the output of the pulsed laser light 35 output from the laser amplifier 30 larger than 20 kW to satisfy the EUV light output>250 W, an optimally suited EUV light generation apparatus for the exposure apparatus can be obtained. When the laser oscillator 20 is a Q-switched and cavity-dumped oscillator, the output thereof is limited to some tens of watts due to the light resistance strength of the electro-optic device 22. Since the output of the laser oscillator 20 is some tens of watts, and for the output of the laser amplifier 30, output larger than 20 kW is required, the amplification factor of the laser amplifier 30 is desirably 1000 times or more. When the laser amplifier 30 is a multi-stage amplifier, a value obtained by dividing the output of a laser pulse output from the last stage by the output of a laser pulse before entering a first-stage amplifier is desirably 1000 times or more.

The laser oscillator 20 is not limited to a single wavelength, and may output a laser pulse including two or more wavelengths. A $CO_2$ laser that outputs two or more wavelengths is called a multi-line $CO_2$ laser. By outputting two or more wavelengths, the effect of a decrease in the amplification factor of the laser amplifier 30 due to rotational relaxation can be reduced to obtain high amplified output. The two or more wavelengths are desirably transition wavelengths between rotational levels of the $CO_2$ laser. For example, in addition to a wavelength of P(20) at which the maximum output is obtained by the $CO_2$ laser, a laser pulse of P(16), P(18), P(22), P(24), etc. may be output.

Figure 10:
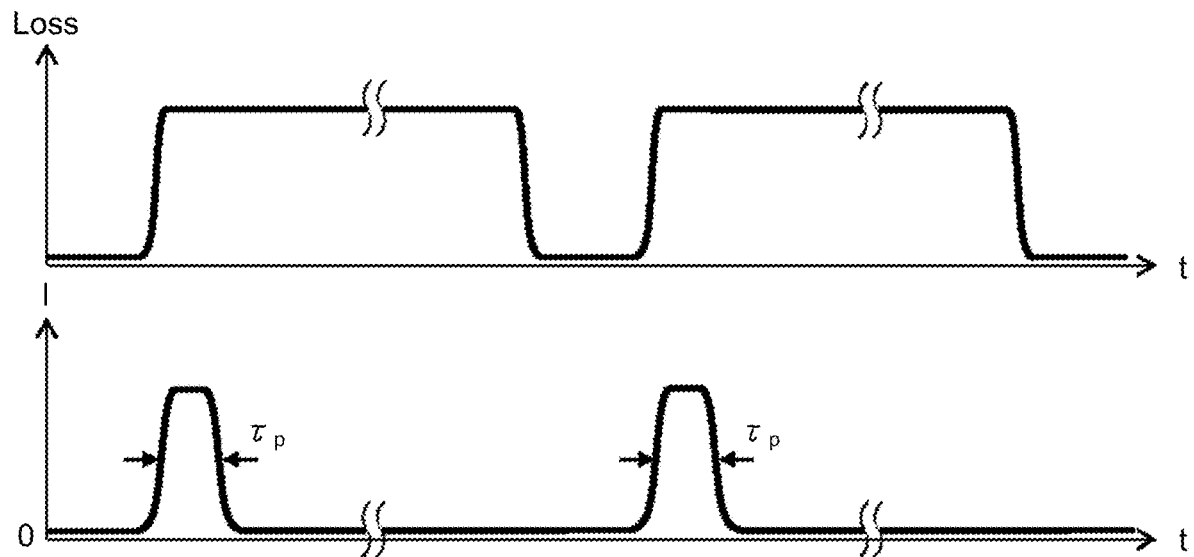
FIG. 10 is an explanatory diagram of super-Gaussian-shaped pulse generation by Q-switched and cavity-dumped oscillation.

In FIG. 3, for the pulsed laser light 25 of 15 ns to 200 ns input to the laser amplifier 30, a super-Gaussian-shaped laser pulse with the ratio $\tau_r<0.72$ is illustrated. Such a super-Gaussian-shaped laser pulse can be provided by, for example, Q-switched and cavity-dumped oscillation described above. In Q-switched and cavity-dumped oscillation, the pulse width $\tau_p$ of an output laser pulse is approximately equal to 2L/c where L is the resonator length, and c is the speed of light. Thus, the resonator length L can be selected such that 2L/c is 15 ns to 200 ns. FIG. 10 is an explanatory diagram of super-Gaussian-shaped pulse generation by Q-switched and cavity-dumped oscillation. As illustrated in an upper row of FIG. 10, when the switching time of the electro-optic device 22, that is, the time during which loss in the resonator is changed from a low-loss state to a high-loss state is sufficiently shorter than the pulse width $\tau_p$, a laser pulse output by Q-switched and cavity-dumped oscillation steeply rises, and a super-Gaussian shape with $T_r<0.72$ is obtained as illustrated in a lower row of FIG. 10.

Figure 11:
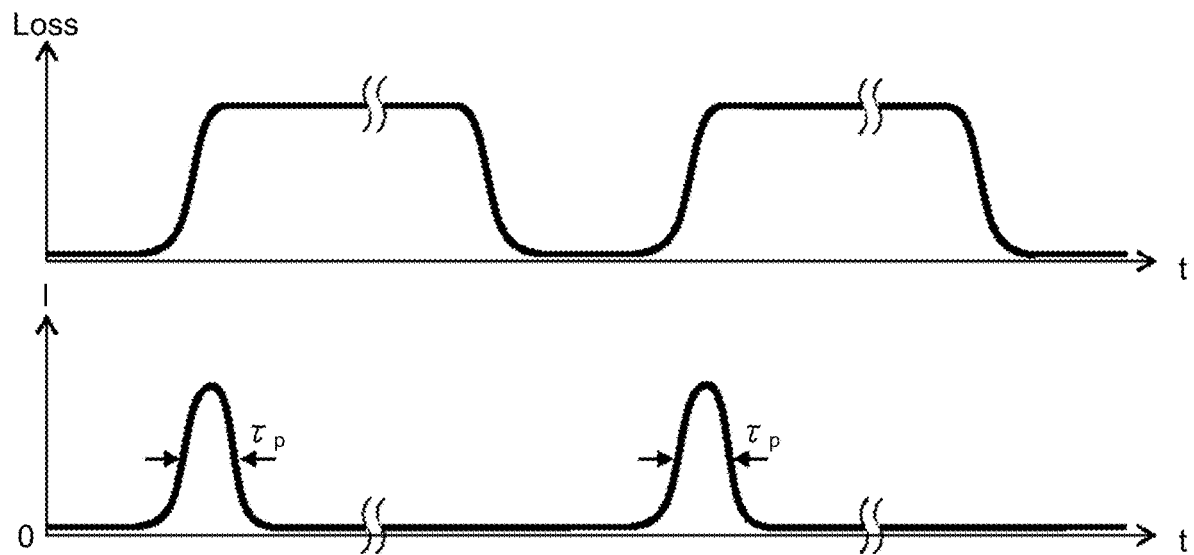
FIG. 11 is an explanatory diagram of Gaussian-shaped pulse generation when the switching time of an electro-optic device is long.

By contrast, as illustrated in an upper row of FIG. 11, when the switching time of the electro-optic device 22 is, for example, about half of the pulse width $\tau_p$, the steep rise of a laser pulse is inhibited by the slow switching of the electro-optic device 22. As a result, the laser pulse shape becomes close to a Gaussian shape as illustrated in a lower row of FIG. 11.

As described with FIGS. 5 and 6, the laser pulse shortening effect in the laser amplifier 30 depends not only on the shape of the incoming laser pulse 25 but also on its pulse width $\tau_p$. This is because, as illustrated in FIG. 4, the normalized extracted energy $\eta_{ext}$ varies depending on the pulse width $\tau_p$ of the incoming laser pulse 25. When the extracted energy next is small, energy in the laser amplifier 30 cannot be sufficiently extracted, so that the sharpening of a front portion of a laser pulse is less likely to occur, and the shortening of the laser pulse is less likely to occur. Thus, as described above, in FIG. 4, the order of decreasing likeliness of occurrence of laser pulse shortening is the order of the regions D, C, B, and A. The configuration according to the first embodiment can make the extracted energy $\eta_{ext}$ higher than that of the typical amplification operation, and thus can increase the pulse shortening effect obtained.

Figure 12:
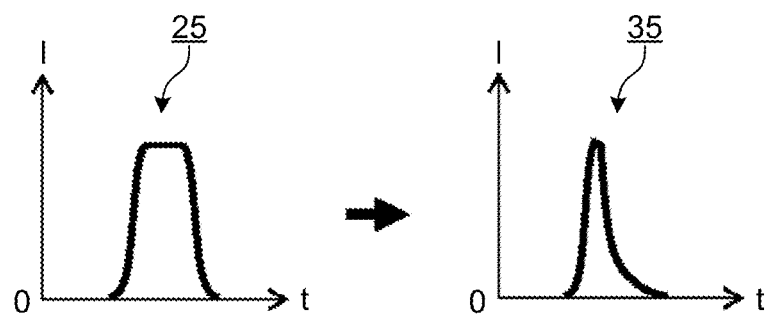
FIG. 12 is a diagram illustrating pulse shortening when a laser pulse of a different pulse width enters the laser amplifier.
Figure 13:
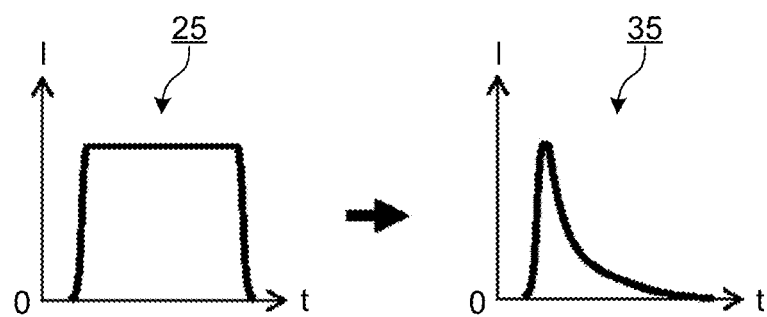
FIG. 13 is a diagram illustrating pulse shortening when a laser pulse of a different pulse width enters the laser amplifier.

FIGS. 12 and 13 illustrate examples of pulse shortening when laser pulses with different pulse widths enter the laser amplifier 30. FIG. 12 illustrates a case where the pulse width of the incoming laser pulse 25 is longer than the pulse width of the outgoing laser pulse 35. In this case, the outgoing laser pulse 35 has a shape that rises steeply and falls gently. FIG. 13 illustrates a case where the pulse width of the incoming laser pulse 25 is longer than that of the incoming laser pulse 25 illustrated in FIG. 12. Although the outgoing laser pulse 35 illustrated in FIG. 13 has a pulse width equivalent to that of the outgoing laser pulse 35 illustrated in FIG. 12, the outgoing laser pulse 35 illustrated in FIG. 13 has a longer fall time than the outgoing laser pulse 35 illustrated in FIG. 12. Consequently, when the output of the outgoing laser pulse 35 illustrated in FIG. 12 is the same as the output of the outgoing laser pulse 35 illustrated in FIG. 13, the outgoing laser pulse 35 illustrated in FIG. 13 has a smaller peak output. As described above, when the pulse width $\tau_p$ of the incoming laser pulse 25 is larger than 200 ns, the extracted energy next does not change significantly. Thus, even when the pulse width $\tau_p$ of the incoming laser pulse 25 is made longer than 200 ns, the amplified output does not change significantly. However, when the pulse width $\tau_p$ of the incoming laser pulse 25 is made longer, the fall time of the outgoing laser pulse 35 becomes longer. Consequently, when the pulse width $\tau_p$ of the incoming laser pulse 25 is made longer than 200 ns, the amplified output does not change significantly while the fall time becomes longer, so that the peak output decreases. Therefore, by setting the pulse width $\tau_p$ of the incoming laser pulse 25 to 200 ns or less, both high amplified output and a pulse with a high peak value can be achieved.

As described above, in the first embodiment, the laser oscillator 20 emits pulsed laser light with the full width at half maximum of between 15 ns and 200 ns for input to the laser amplifier 30, and the laser amplifier 30 passes the pulsed laser light through the amplifier laser active medium to shorten the pulse width to pulsed laser light with the full width at half maximum of between 5 ns and 30 ns for output. Thus, the first embodiment can generate pulsed laser light that has the optimum full width at half maximum of between 5 ns and 30 ns for the generation of high-power extreme ultraviolet light, and has a high output of 20 kW or higher.

Furthermore, the first embodiment performs amplification operation such that the value $\tau_r$ ($=\tau_b/\tau_p$) obtained by dividing the full width at half maximum $\tau_p$ of the pulsed laser light 25 input to the laser amplifier 30 by the rise time $\tau_b$, which is the time from when the intensity of the pulsed laser light 25 input to the laser amplifier 30 increases to 10% of the maximum intensity to when the intensity increases to 90% of the maximum intensity, becomes smaller than 0.72, and thus can provide a remarkable pulse shortening effect.

Second Embodiment

Figure 14:
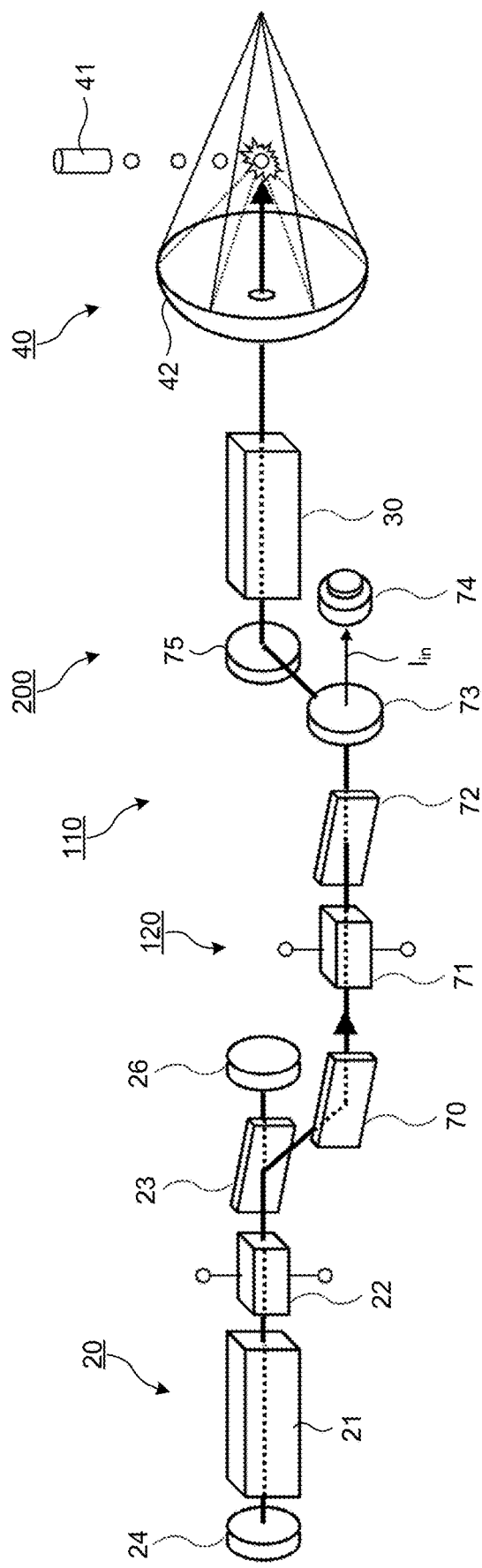
FIG. 14 is a diagram illustrating a configuration of an extreme ultraviolet light generation apparatus including a laser amplification device according to a second embodiment.

FIG. 14 is a diagram illustrating a configuration of an extreme ultraviolet light generation apparatus 200 including a laser amplification device 110 according to a second embodiment. In FIG. 14, the laser amplification device 110 includes the laser oscillator 20, a transmission optical system 120, and the laser amplifier 30. The transmission optical system 120 includes a polarization beam splitter 70, an electro-optic device 71, a polarization beam splitter 72, a beam splitter 73, a waveform measurement sensor 74, and a mirror 75. The electro-optic device 71, the polarization beam splitter 70, and the polarization beam splitter 72 function as both an optical isolator and a pulse shape shaper. The waveform measurement sensor 74 measures the waveform $I_{in}$ of pulsed laser light before being input to the laser amplifier 30.

Figure 15:
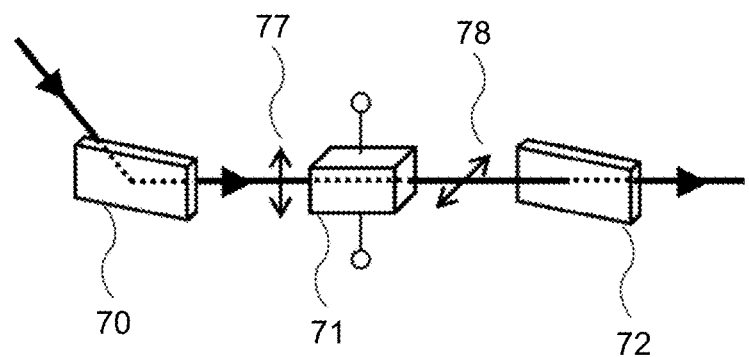
FIG. 15 is a diagram illustrating going light traveling from a laser oscillator to a laser amplifier in the laser amplification device according to the second embodiment.
Figure 16:
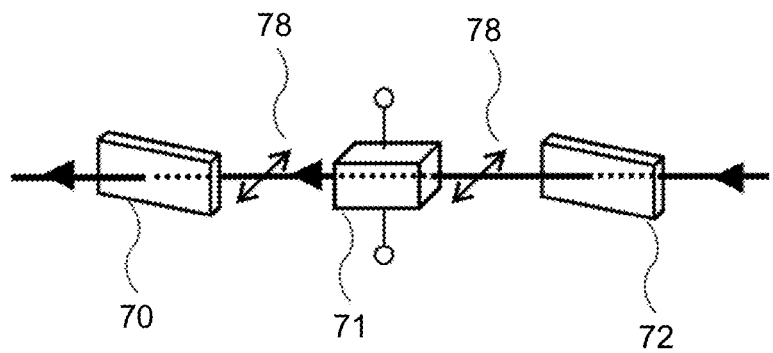
FIG. 16 is a diagram illustrating return light traveling from the laser amplifier to the laser oscillator in the laser amplification device according to the second embodiment.
Figure 17:
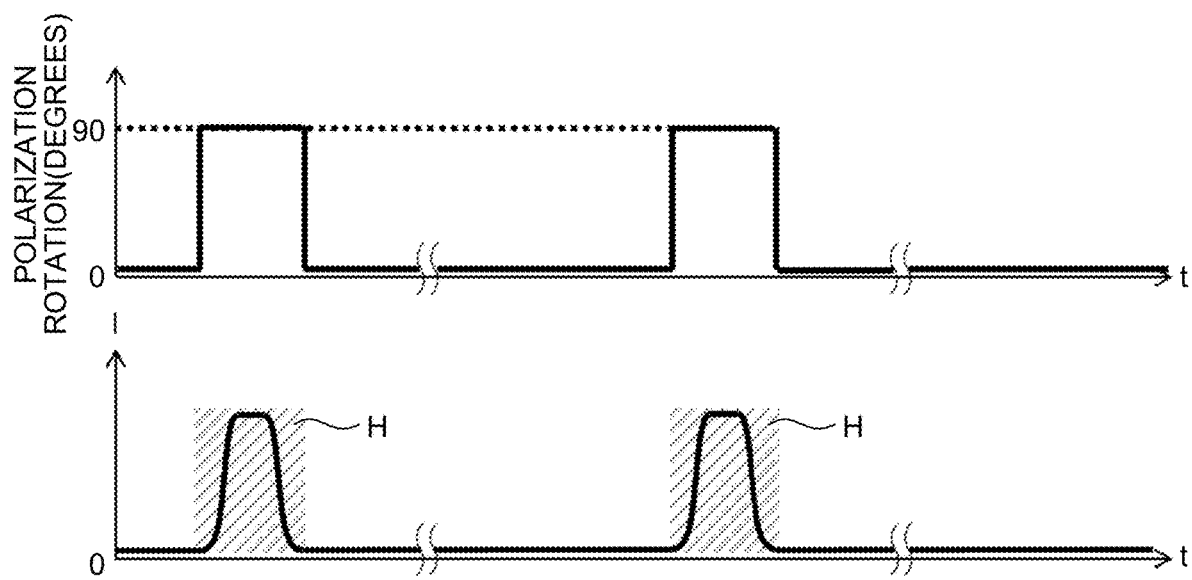
FIG. 17 is a time chart of a voltage applied to an electro-optic device and a time chart of a laser pulse output from the laser oscillator.

The operation of the electro-optic device 71, the polarization beam splitter 70, and the polarization beam splitter 72 as the optical isolator will be described with reference to FIGS. 15, 16, and 17. FIG. 15 illustrates going light traveling from the laser oscillator 20 to the laser amplifier 30. FIG. 16 illustrates return light traveling from the laser amplifier 30 to the laser oscillator 20. FIG. 17 is a diagram illustrating a time chart of an applied voltage for rotating polarized light 90 degrees in the electro-optic device 71 and a time chart of a laser pulse output from the laser oscillator 20. A region provided with a shade H in FIG. 17 corresponds to a period during which the applied voltage in FIG. 17 is on.

The applied voltage for rotating polarized light 90 degrees is applied to the electro-optic device 71 in synchronization with the repetition frequency of laser pulses output from the laser oscillator 20. Then, as illustrated in FIG. 15, the going light that has passed through the electro-optic device 71 rotates 90 degrees from vertical polarized light 77 to horizontal polarized light 78 only during the ON period of the applied voltage illustrated in an upper row of FIG. 17. As a result, as illustrated in a lower row of FIG. 17, only a pulse provided with the shade H is cut out and transmitted through the polarization beam splitter 72, and the rest is reflected by the polarization beam splitter 72.

The return light from the laser amplifier 30 side is, for example, self-oscillating light of the laser amplifier 30 etc. The return light from the laser amplifier 30 side is out of synchronization with the voltage applied to the electro-optic device 71 illustrated in the upper row of FIG. 17. Thus, even when the return light passes through the electro-optic device 71, polarized light does not rotate, so that the horizontal polarized light 78 is maintained. As a result, as illustrated in FIG. 16, the return light from the laser amplifier 30 side does not pass through the polarization beam splitter 70 and does not return to the laser oscillator 20. Consequently, the laser oscillator 20 can stably oscillate without being affected by the return light. Using the same principle, the electro-optic device 71 and the polarization beam splitters 70 and 72 can prevent parasitic oscillations that occur between the laser oscillator 20 and the laser amplifier 30. Although FIG. 14 illustrates the polarization beam splitters 70 and 72, absorbing thin-film reflectors (ATFRs), which are optical elements having the same function, or the like may be used.

Figure 18:
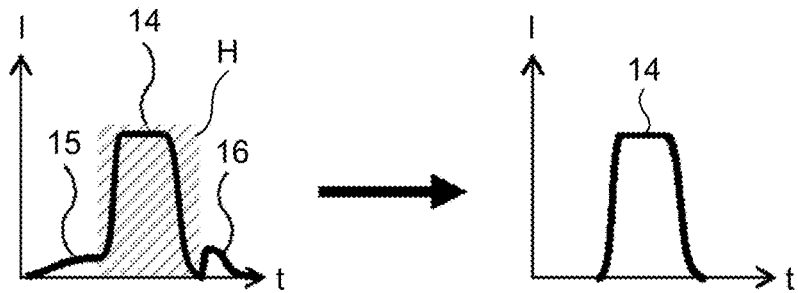
FIG. 18 is a diagram illustrating an operation of the electro-optic device and a polarization beam splitter as a pulse shaper.

FIG. 18 illustrates the operation of the electro-optic device 71, the polarization beam splitter 70, and the polarization beam splitter 72 as the pulse shaper. A region provided with a shade H in FIG. 18 corresponds to a period during which the applied voltage for rotating polarized light 90 degrees in the electro-optic device 71 is on, as illustrated in FIG. 17. The laser pulse with a pulse width of 15 ns to 200 ns illustrated in FIG. 3 is illustrated in the super-Gaussian shape with $\tau_r$<0.72. However, in this super-Gaussian-shaped laser pulse, as illustrated on the left side in FIG. 18, a pedestal 15 may appear before a main pulse 14, and a post pulse 16 or the like may appear after the main pulse 14. When the pedestal 15 or the post pulse 16 enters the laser amplifier 30, consuming energy in the laser amplifier 30, amplification of the main pulse 14 is hindered. Thus, as indicated by the shade H in FIG. 18, polarized light of only the main pulse 14 is rotated 90 degrees and cut out by the electro-optic device 71, so that a pulse measured by the waveform measurement sensor 74 includes only the main pulse 14 with the pedestal 15 and the post pulse 16 removed as illustrated on the right side in FIG. 18. In the pulse illustrated on the right side in FIG. 18, since the pedestal 15 and the post pulse 16 are removed, the pedestal 15 and the post pulse 16 do not consume energy in the laser amplifier 30, and the amplified output of the main pulse 14 is increased.

Figure 19:
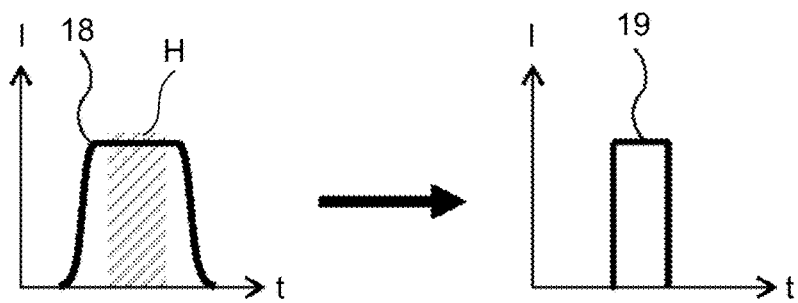
FIG. 19 is a diagram illustrating an operation of the electro-optic device and the polarization beam splitter as the pulse shaper.

FIG. 19 illustrates a second example of pulse shaping. A region provided with a shade H in FIG. 19 corresponds to a period during which the applied voltage for rotating polarized light 90 degrees in the electro-optic device 71 is on, as illustrated in FIG. 17. In FIG. 19, by controlling the pulse width of the applied voltage for rotating polarized light 90 degrees in the electro-optic device 71, a laser pulse 19 with a pulse width of 15 ns to 200 ns is cut out from a laser pulse 18 output from the electro-optic device 71. As a result, as described in the first embodiment, the pulse width of a laser pulse output from the laser amplifier 30 can be set to 5 ns to 30 ns, and EUV light output by the EUV light generator 40 can be increased. When the cut-out laser pulse has a rectangular shape, the laser amplifier 30 provides a more remarkable effect of shortening the pulse.

Figure 20:
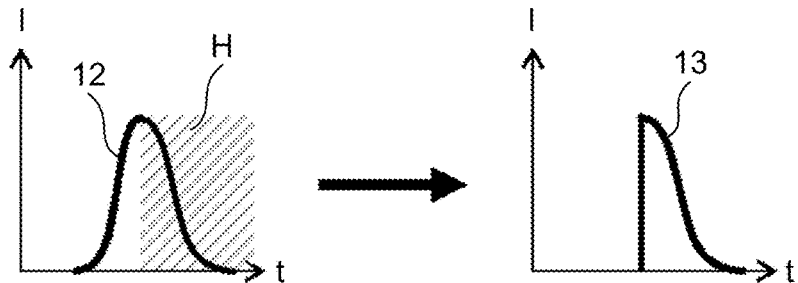
FIG. 20 is a diagram illustrating an operation of the electro-optic device and the polarization beam splitter as the pulse shaper.

FIG. 20 illustrates a third example of pulse shaping. A region provided with a shade H in FIG. 20 corresponds to a period during which the applied voltage for rotating polarized light 90 degrees in the electro-optic device 71 is on, as illustrated in FIG. 17. When the laser oscillator 20 is made to oscillate by Q-switched oscillation or the like, a Gaussian shape like a laser pulse 12 illustrated on the left side in FIG. 20 may be formed. Then, by cutting out only the region provided with the shade H, that is, a rear portion of the laser pulse 12 by the electro-optic device 71, the waveform measurement sensor 74 measures a laser pulse 13 as illustrated on the right side in FIG. 20. In the laser pulse 13, the intensity of a front portion of the pulse is larger than the intensity of a rear portion, and the front portion has a sharpened shape. When the laser pulse 13 of this shape is passed through the laser amplifier 30, the sharpening of the pulse front portion remarkably appears due to amplification, and a more remarkable pulse shortening effect can be obtained.

Figure 21:
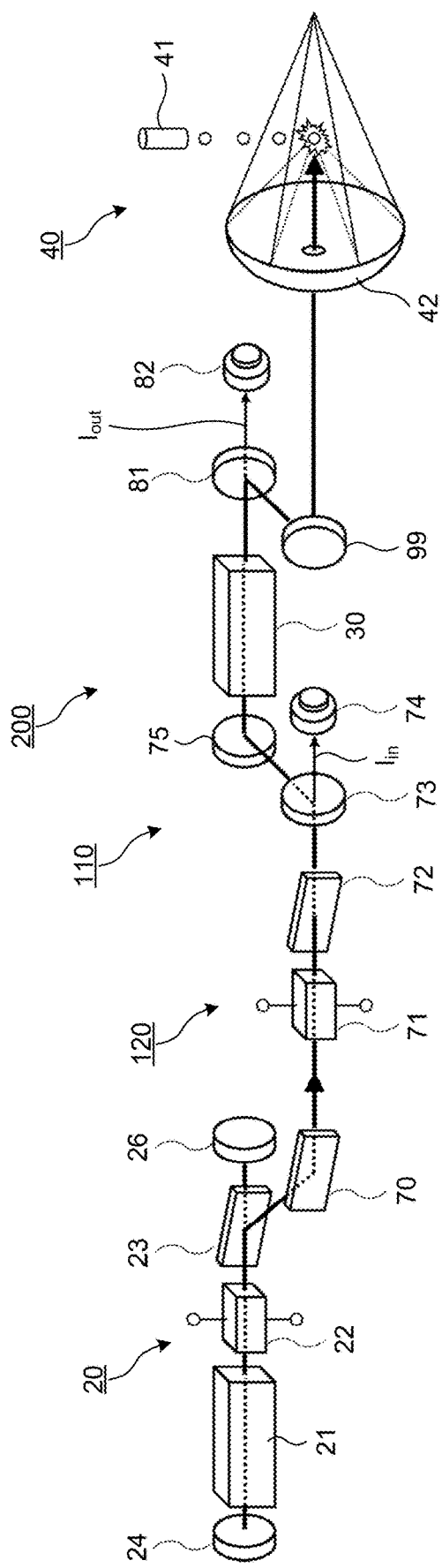
FIG. 21 is a diagram illustrating another configuration of the extreme ultraviolet light generation apparatus including the laser amplification device according to the second embodiment.

FIG. 21 is a diagram illustrating a modification of the extreme ultraviolet light generation apparatus 200 including the laser amplification device 110 illustrated in FIG. 14. In FIG. 21, a beam splitter 81, a waveform measurement sensor 82, and a mirror 99 are added to the extreme ultraviolet light generation apparatus 200 illustrated in FIG. 14. Part of a laser pulse output from the laser amplifier 30 is extracted by the beam splitter 81, and its shape is measured by the waveform measurement sensor 82. The waveform measurement sensor 82 measures the waveform $I_{out}$ of pulsed laser light output from the laser amplifier 30. By monitoring the waveform $I_{out}$, it can be determined whether the waveform $I_{out}$ is an optimum laser pulse for conversion into EUV light.

Figure 22:
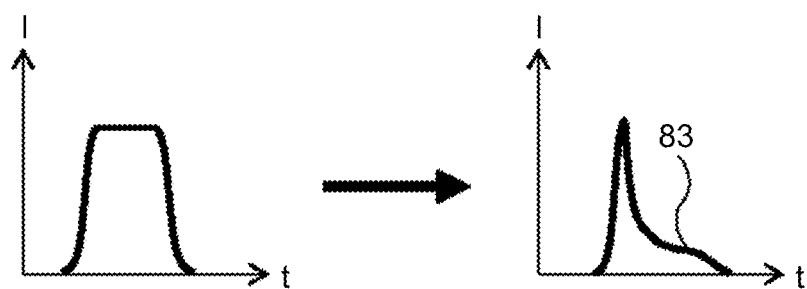
FIG. 22 is a diagram illustrating laser pulses input to and output from the laser amplifier.

A laser pulse illustrated on the left side in FIG. 22 indicates the shape of a laser pulse input to the laser amplifier 30, which is measured by the waveform measurement sensor 74. A laser pulse illustrated on the right side in FIG. 22 indicates an example of the shape of a laser pulse output from the laser amplifier 30, which is measured by the waveform measurement sensor 82. As illustrated in FIG. 22, the laser pulse before being input to the laser amplifier 30 may have a shape including a post pedestal 83 in a rear portion of a main pulse after being amplified by the laser amplifier 30.

Figure 23:
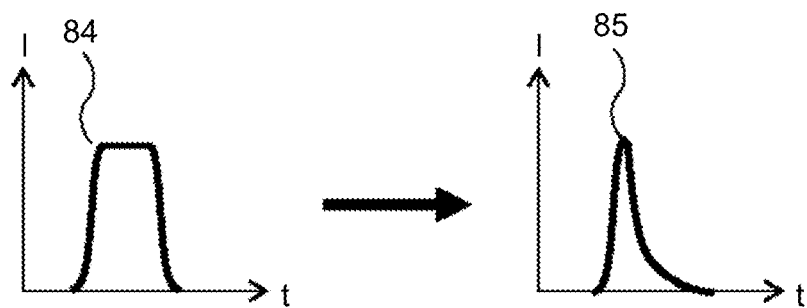
FIG. 23 is a diagram illustrating laser pulses input to and output from the laser amplifier.

Then, the pulse shape measured by the waveform measurement sensor 82 is monitored, and the electro-optic device 71 is adjusted to cut out a laser pulse 84 as illustrated on the left side in FIG. 23 so that there is no post pedestal in a post-amplification laser pulse shape as in a laser pulse 85 illustrated on the right side in FIG. 23. By using the waveform measurement sensor 82, optimum cutting out of a laser pulse shape as illustrated on the left side in FIG. 23 can be achieved, and an optimum laser pulse can be input to the EUV light generator 40 to increase EUV light output generated. Here, adjustment is made so that no post pedestal appears, but the electro-optic device 71 may be adjusted to cut out a laser pulse such that a laser pulse shape to increase EUV light output is formed.

As described above, the second embodiment controls the period during which the polarization rotation function of the electro-optic device 71 is on to make the electro-optic device 71, the polarization beam splitter 70, and the polarization beam splitter 72 function as the optical isolator, whereby the laser oscillator 20 can stably oscillate without being affected by return light. Furthermore, by controlling the period during which the polarization rotation function of the electro-optic device 71 is on, the electro-optic device 71, the polarization beam splitter 70, and the polarization beam splitter 72 are made to function as the pulse shaper, whereby the pedestal 15 or the post pulse 16 appearing before and after the main pulse 14 can be removed, and the pulse width can be shortened and shaped, so that the amplification performance in the laser amplifier 30 can be improved. Moreover, laser pulses input to and output from the laser amplifier 30 are monitored, and the electro-optic device 71 is controlled using the monitoring results, so that an optimum laser pulse can be input to the EUV light generator 40.

Third Embodiment

Figure 24:
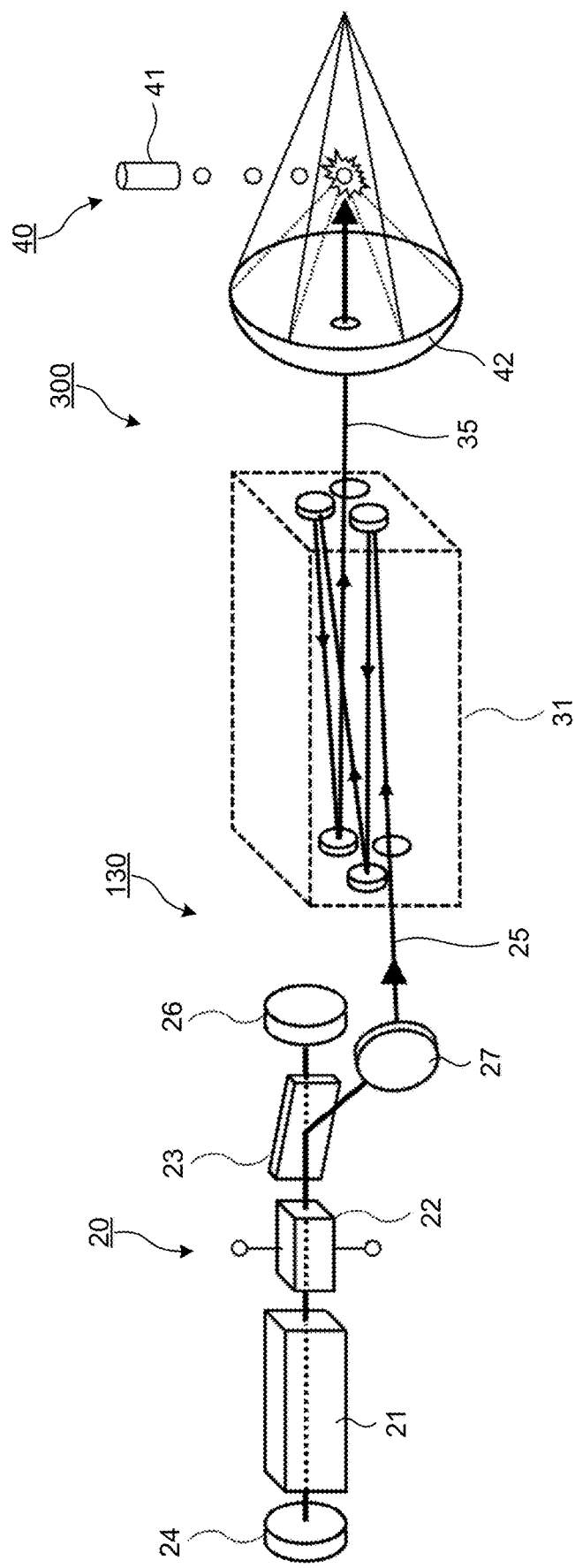
FIG. 24 is a diagram illustrating a configuration of an extreme ultraviolet light generation apparatus including a laser amplification device according to a third embodiment.

FIG. 24 is a diagram illustrating a configuration of an extreme ultraviolet light generation apparatus 300 including a laser amplification device 130 according to a third embodiment. In FIG. 24, the laser amplification device 130 includes the laser oscillator 20, the mirror 27, and a multipath laser amplifier 31. In FIG. 24, the laser amplifier 30 in the extreme ultraviolet light generation apparatus 100 illustrated in FIG. 3 is replaced with the multipath laser amplifier 31. In FIG. 3, when the fluence $E_{in}$ of the incoming laser pulse 25 is sufficiently larger than the saturation fluence $E_s$ of the laser amplifier 30, energy stored in the laser amplifier 30 can be sufficiently extracted, and high amplified output can be obtained. However, when the fluence $E_{in}$ of the incoming laser pulse 25 is smaller than the saturation fluence $E_s$ of the laser amplifier 30, energy stored in the laser amplifier 30 cannot be sufficiently extracted. As a result, the pulse shortening effect cannot be sufficiently obtained. Thus, when the fluence $E_{in}$ of the incoming laser pulse 25 is smaller than the saturation fluence $E_s$ of the laser amplifier 30, by using the multipath laser amplifier 31 as illustrated in FIG. 24, energy extraction efficiency can be further increased. As a result, high amplified output can be obtained, and as a result, high EUV light output can be obtained. Although FIG. 24 illustrates a five-path amplifier in which the number of paths is five, the number of paths may be two or more, and the number of paths is not limited to five.

Figure 25:
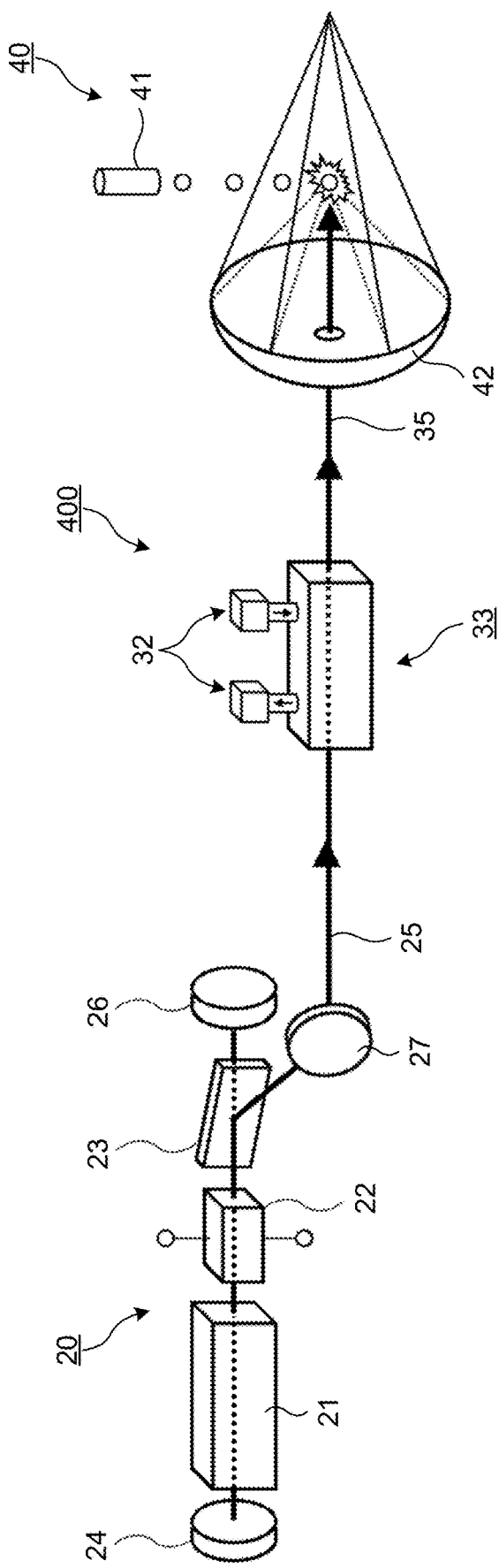
FIG. 25 is a diagram illustrating another configuration of the extreme ultraviolet light generation apparatus including the laser amplification device according to the third embodiment.

When the fluence $E_{in}$ of the incoming laser pulse 25 is smaller than the saturation fluence $E_s$ of the laser amplifier 30, for example, by optimizing the gas pressure in the laser amplifier 30, an optimum pulse shape for higher amplified output and high EUV light output can be obtained. In an extreme ultraviolet light generation apparatus 400 in FIG. 25, a laser amplifier 33 includes a gas pressure adjustment mechanism 32 that adjusts the gas pressure of laser gas. The other components are the same as those of the extreme ultraviolet light generation apparatus 100 illustrated in FIG. 3. In the $CO_2$ laser, the saturation fluence $E_s$ increases in proportion to the gas pressure N. Thus, when the gas pressure N is lowered, the saturation fluence $E_s$ decreases. Conversely, when the gas pressure N is raised, the saturation fluence $E_s$ increases. When the fluence $E_{in}$ of the incoming pulse is the same, the saturation fluence $E_s$ can be adjusted by adjusting the gas pressure N, and energy that can be extracted from the laser amplifier 33 can be adjusted.

Figure 26:
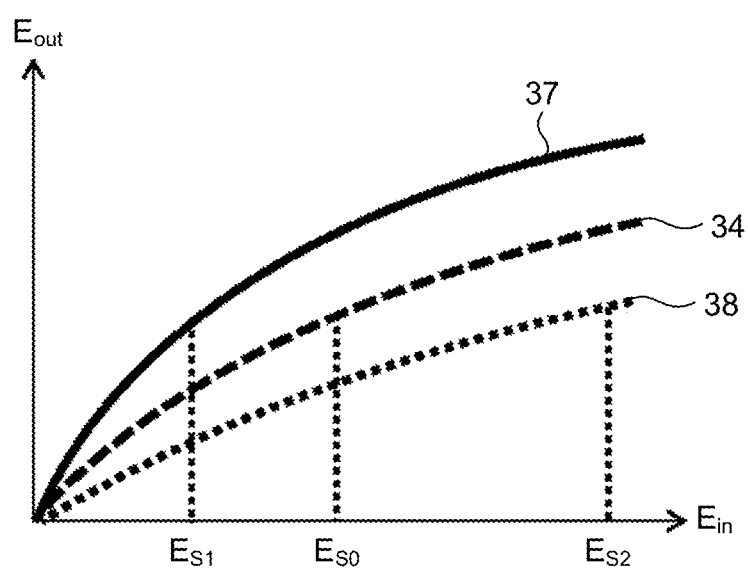
FIG. 26 is a graph illustrating an example of amplification characteristics when the gas pressure of a $CO_2$ laser amplifier is changed.

FIG. 26 is a graph illustrating an example of amplification characteristics when the gas pressure N of the laser amplifier 33 is changed. Esc) is the saturation fluence at an initial gas pressure, Est is the saturation fluence when the gas pressure is lowered from the initial gas pressure, and Est is the saturation fluence when the gas pressure is raised from the initial gas pressure. As illustrated in FIG. 26, when the gas pressure is lowered from the initial gas pressure, $E_{s1}<E_{s0}$, so that a graph 34 of the amplification characteristics changes to a graph 37. At this time, the saturation characteristics of an amplified output $E_{out}$ appear more remarkably relative to an increase in the fluence $E_{in}$ of the incoming pulse. On the other hand, when the gas pressure is raised from the initial gas pressure, $E_{s0}<E_{s2}$, so that the graph 34 of the amplification characteristics changes to a graph 38. At this time, the saturation characteristics of the amplified output $E_{out}$ are obscure relative to an increase in the fluence $E_{in}$ of the incoming pulse and become close to linear characteristics. Thus, when the fluence $E_{in}$ of the incoming laser pulse 25 is smaller than the saturation fluence $E_s$ of the laser amplifier 33, and energy stored in the laser amplifier 33 cannot be sufficiently extracted, for example, by lowering the gas pressure, the saturation fluence $E_s$ can be reduced, and the amplified output can be increased. Conversely, when it is desired to lower the amplified output, the gas pressure can be increased. When the gas pressure is changed, impedance may not be matched between a discharge circuit and an amplifier of the laser amplifier 33. When there is an impedance mismatch, discharge power that is power used for discharge cannot be effectively used. Thus, when the impedance is matched, the discharge power can be effectively used, and the amplified output can be further improved.

Figure 27:
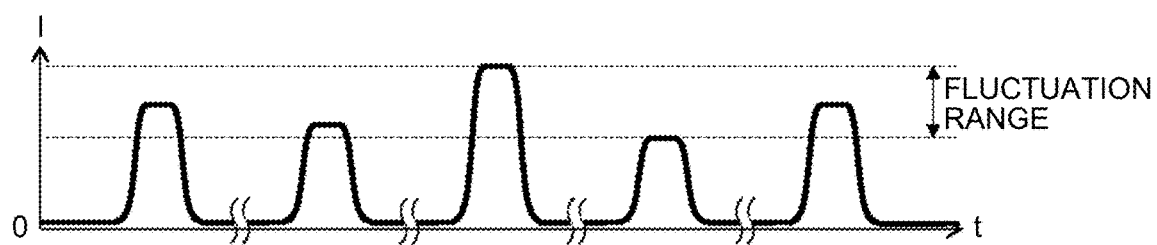
FIG. 27 is a diagram illustrating a case where there are intense fluctuations in repetitive pulses output from an oscillator.
Figure 28:
FIG. 28 is a diagram illustrating reduction of the fluctuations in the repetitive pulses after amplification.

Furthermore, when the gas pressure is decreased, in addition to an increase in the amplified output, the extracted energy from the amplifier is increased, so that the effect that the pulse shortening becomes remarkable is obtained. Moreover, the use of the saturation amplification characteristics as in the graph 37 allows an improvement in the stability of repetitive pulses output from the laser oscillator 20. The following explains that. FIG. 27 illustrates a case where there are intense fluctuations in repetitive pulses output from the laser oscillator 20. When there are such fluctuations, amplification by the laser amplifier whose amplified output is saturated as in the graph 37 can reduce fluctuations in post-amplification repetitive pulses as illustrated in FIG. 28. As a result, pulse stability can be improved. As described above, when the gas pressure is decreased by the gas pressure adjustment mechanism 32, three effects of an increase in amplified output, remarkable pulse shortening, and an improvement in pulse stability can be simultaneously obtained. In the present embodiment, when the gas pressure is adjusted in the range of gas pressures at which the rotational relaxation time is some nanoseconds, the above three effects can be expected. The rotational relaxation time is some nanoseconds typically at about 20 Torr to 100 Torr. Thus, the gas pressure can be adjusted in the range of 20 Torr to 100 Torr.

The improvement of the pulse stability of incoming pulses is obtained by the amplification characteristics with a tendency toward saturation. Thus, for example, when the fluence $E_{in}$ of the incoming laser pulse 25 is sufficiently larger than the saturation fluence $E_s$ of the laser amplifier 30, the multipath laser amplifier 31 can also provide the same effect of improving the pulse stability.

As described above, the third embodiment uses the multipath laser amplifier 31, and thus can further increase the energy extraction efficiency and can provide high amplified output. In addition, the gas pressure of the laser gas in the laser amplifier 33 is adjusted to be lowered, so that the saturation fluence $E_s$ of the laser amplifier can be reduced, and the amplified output of the laser amplifier can be increased.

Fourth Embodiment

Figure 29:
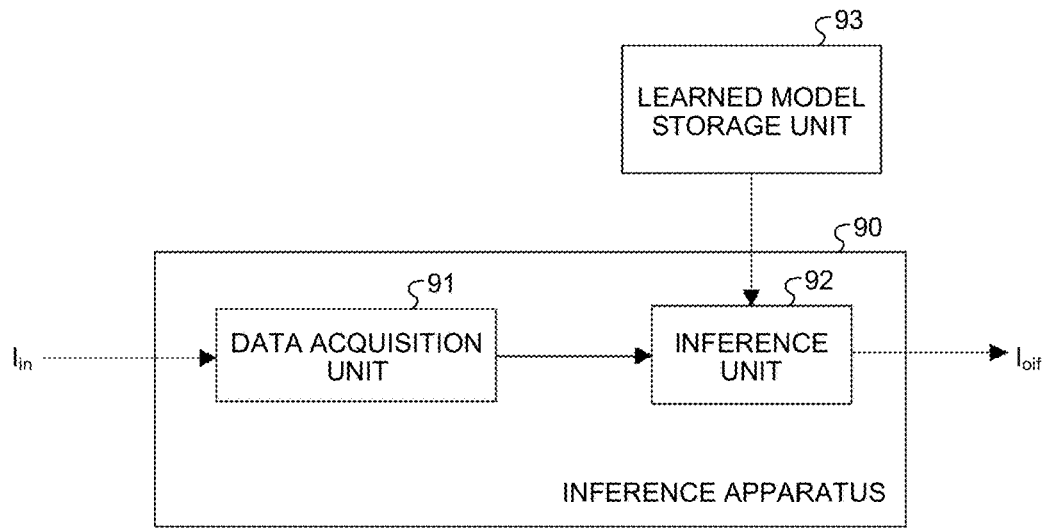
FIG. 29 is a diagram illustrating an example of an inference apparatus that infers a pulse shape output from a laser amplifier according to a fourth embodiment.

FIG. 29 is a diagram illustrating an inference apparatus 90 that infers the pulse shape of the pulsed laser light 35 output from the laser amplifier 30 of the laser amplification device 110 illustrated in FIG. 14 or 21. The inference apparatus 90 includes a data acquisition unit 91 and an inference unit 92. The data acquisition unit 91 acquires the pre-amplification laser pulse shape $I_{in}$ measured by the waveform measurement sensor 74 illustrated in FIG. 14 or 21. The inference unit 92 infers a laser pulse shape after being amplified by the laser amplifier 30, using a learned model storage unit 93. That is, by inputting the laser pulse shape $I_{in}$ acquired by the data acquisition unit 91 to a learned model stored in the learned model storage unit 93, a post-amplification pulse shape $I_{oif}$ inferred by the inference unit 92 can be output from the inference unit 92. Using the inference apparatus 90, the pre-amplification pulse shape may be optimized by the pulse shaper consisting of the electro-optic device 71, the polarization beam splitter 70, and the polarization beam splitter 72 illustrated in FIG. 14 so that the inferred post-amplification pulse shape $I_{oif}$ becomes an optimum pulse of 5 ns to 30 ns for EUV light generation. By this optimization, high-power EUV light can be generated.

Figure 30:
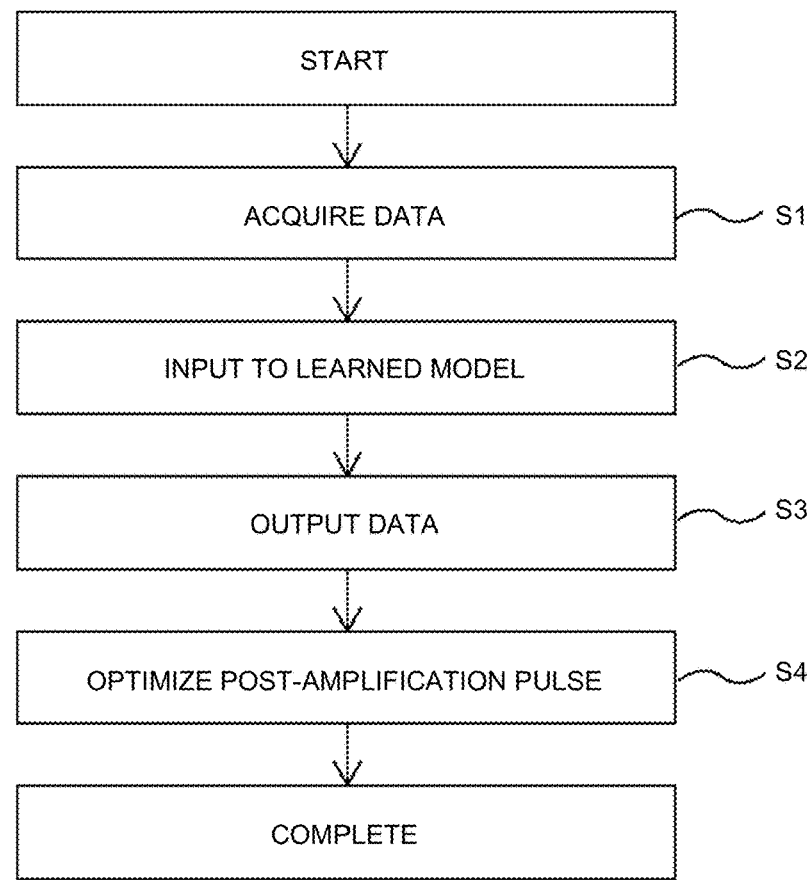
FIG. 30 is a flowchart illustrating a processing procedure of the inference apparatus.

FIG. 30 is a flowchart illustrating a processing procedure of the inference apparatus 90. In step S1, the data acquisition unit 91 acquires the pre-amplification pulse shape $I_{in}$ measured by the waveform measurement sensor 74. In step S2, the inference unit 92 inputs the pulse shape $I_{in}$ to the learned model stored in the learned model storage unit 93 to obtain the inferred post-amplification pulse shape $I_{oif}$. In step S3, the inference unit 92 outputs the pulse shape $I_{oif}$ obtained by the learned model to the extreme ultraviolet light generation apparatus 200. In step S4, the extreme ultraviolet light generation apparatus 200 optimizes the post-amplification pulse to laser pulse light having a pulse width of 5 ns to 30 ns, using the inferred pulse shape $I_{oif}$. As a result, high-power EUV light can be generated.

Figure 31:
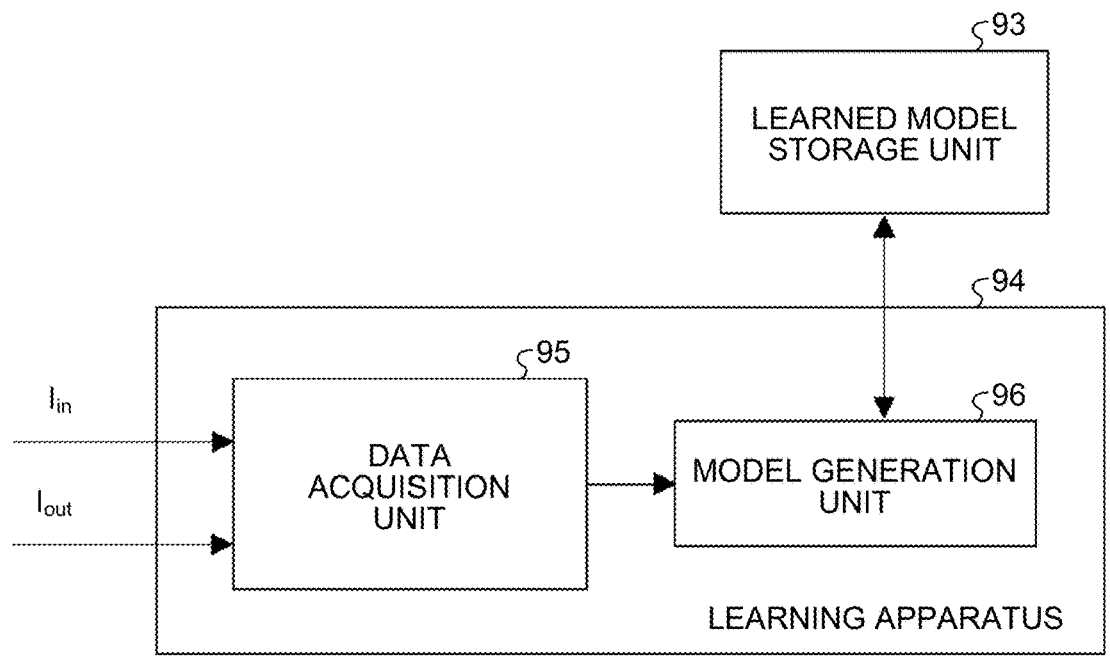
FIG. 31 is a diagram illustrating an example of a learning apparatus that learns a pulse shape output from the laser amplifier according to the fourth embodiment.

FIG. 31 illustrates a learning apparatus 94 that generates the learned model used by the inference apparatus 90 illustrated in FIG. 29. The learning apparatus 94 includes a data acquisition unit 95, a model generation unit 96, and the learned model storage unit 93. In the present embodiment, a case where a learning algorithm used by the model generation unit 96 is supervised learning is described, but a known algorithm such as unsupervised learning or reinforcement learning may be used. The data acquisition unit 95 acquires the pre-amplification laser pulse shape $I_{in}$ measured by the waveform measurement sensor 74 and the post-amplification laser pulse shape $I_{out}$ measured by the waveform measurement sensor 82 illustrated in FIG. 21.

The model generation unit 96 learns the output $I_{oif}$ that is the post-amplification pulse shape, based on learning data generated based on the laser pulse shape $I_{in}$ and the laser pulse shape $I_{out}$ output from the data acquisition unit 95. That is, the learned model that estimates the output $I_{oif}$ from the inputs $I_{in}$ and $I_{out}$ is generated. Here, the learning data is data in which the inputs $I_{in}$ and $I_{out}$ are associated with each other.

Figure 32:
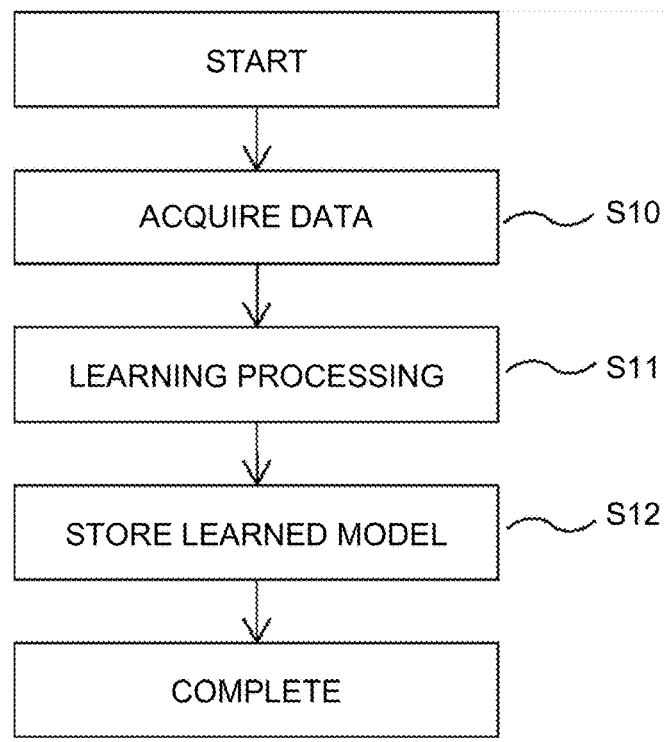
FIG. 32 is a flowchart illustrating a processing procedure of the learning apparatus.

FIG. 32 is a flowchart illustrating a processing procedure of the learning apparatus 94. In step S10, the data acquisition unit 95 acquires the inputs $I_{in}$ and $I_{out}$. It is not necessary to acquire the inputs $I_{in}$ and $I_{out}$ at the same time. It is only necessary to acquire the inputs $I_{in}$ and $I_{out}$ in association with each other. Each of them may be acquired at a different timing. In step S11, the model generation unit 96 learns the output $I_{oif}$ by so-called supervised learning, according to the learning data created based on the combination of the inputs $I_{in}$ and $I_{out}$ acquired by the data acquisition unit 95, to generate the learned model. In step S12, the learned model storage unit 93 stores the learned model generated by the model generation unit 96.

The model generation unit 96 may learn the output $I_{oif}$ according to learning data created for two or more EUV light generation apparatuses. For example, learning data may be acquired from two or more EUV light generation apparatuses used in the same area, or learning data may be acquired from two or more EUV light generation apparatuses that independently operate in different areas. Further, an EUV light generation apparatus from which to collect learning data may be added to or excluded from those in the middle. Furthermore, a learning apparatus that has learned the output $I_{oif}$ for a certain EUV light generation apparatus may be applied to a different EUV light generation apparatus, and the output $I_{oif}$ may be relearned and updated for the different EUV light generation apparatus.

Moreover, as the learning algorithm used by the model generation unit 96, deep learning to learn extraction of features themselves may be used, and machine learning may be executed according to another known method such as genetic programming, functional logic programming, or a support vector machine.

Figure 33:
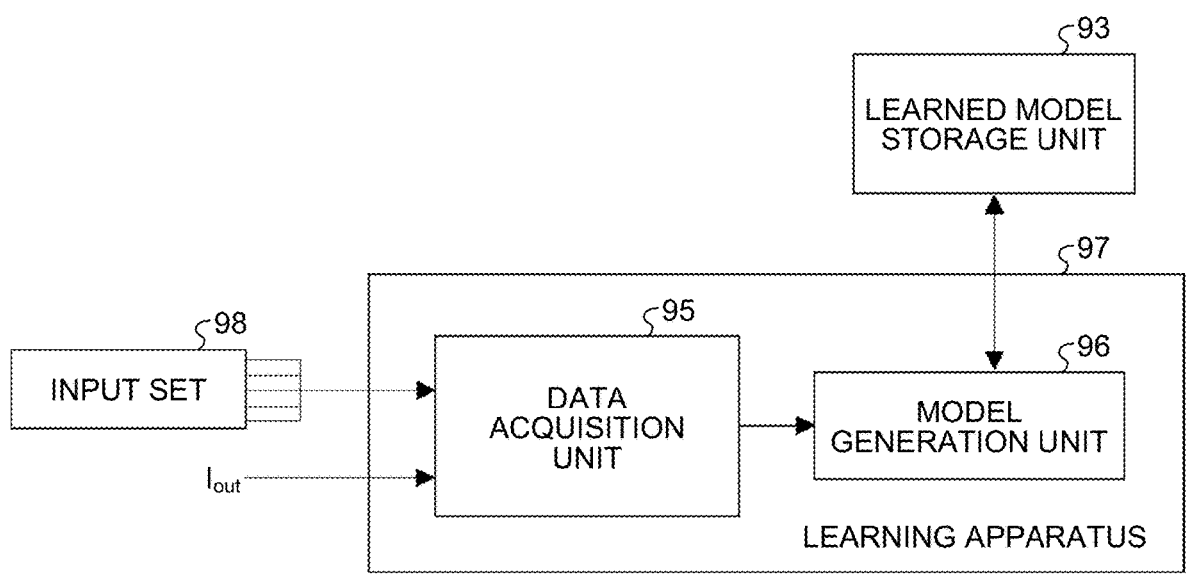
FIG. 33 is a diagram illustrating an example of another learning apparatus according to the fourth embodiment.

In FIG. 33, the learning apparatus 97 learns the output $I_{oif}$ using an input set 98 including a plurality of different parameter values and the input $I_{out}$ as learning data. The input set 98 includes the pre-amplification pulse shape $I_{in}$, the gas pressure in the laser amplifier 30, and the number of paths in the laser amplifier 30 as parameters. Factors that can change the post-amplification pulse shape described in the first to third elements may be input to the input set 98. Factors such as the discharge power of the laser amplifier 30 and the output of the laser oscillator 20 may be added to the input set 98.

The model generation unit 96 learns the output $I_{oif}$, which is the post-amplification pulse shape, by so-called supervised learning, according to learning data created based on the input set 98 and the input $I_{out}$ acquired by the data acquisition unit 95, to generate the learned model. The learned model storage unit 93 stores the learned model generated by the model generation unit 96.

When the learned model learned by the learning apparatus 97 is applied to the inference apparatus 90, the data acquisition unit 91 illustrated in FIG. 29 acquires the input set 98 instead of the input $I_{in}$. The inference unit 92 in FIG. 29 uses the learned model stored in the learned model storage unit 93 to infer the pulse shape after being amplified by the laser amplifier 30. That is, by inputting the input set 98 acquired by the data acquisition unit 91 to the learned model, the post-amplification pulse shape $I_{oif}$ inferred by the inference unit 92 can be output from the inference unit 92. Factors such as the pre-amplification pulse shape, the gas pressure in the laser amplifier 30, and the number of paths in the laser amplifier 30 may be optimized so that the inferred post-amplification pulse shape $I_{oif}$ becomes an optimum pulse of 5 ns to 30 ns for EUV light generation. By this optimization, high-power EUV light can be generated. Furthermore, by using the input set 98 including a plurality of factors as the input $I_{in}$, the plurality of factors can be optimized, and higher-power EUV light can be generated.

The configurations described in the above embodiments show an example of the subject matter of the present disclosure, and can be combined with another known technique. The configurations can be partly omitted or changed without departing from the gist of the present disclosure.

REFERENCE SIGNS LIST 10, 110, 130 laser amplification device; 20 laser oscillator; 21 laser active medium; 22, 71 electro-optic device; 23, 70, 72 polarization beam splitter; 24, 26 resonator mirror; 25 pulsed laser light (incoming laser pulse); 30, 33 laser amplifier; 31 multipath laser amplifier; 32 gas pressure adjustment mechanism; 35 pulsed laser light (outgoing laser pulse); 40 EUV light generator; 41 droplet generator; 42 collector mirror; 50 EUV light; 60 intermediate focus point; 70, 72 polarization beam splitter; 74, 82 waveform measurement sensor; 90 inference apparatus; 94, 97 learning apparatus; 100, 200, 300, 400 extreme ultraviolet light generation apparatus (EUV light generation apparatus); 120 transmission optical system.

The invention claimed is:

1. A laser amplification device comprising:
a laser oscillator including a first laser active medium including a mixed gas containing carbon dioxide gas to emit pulsed laser light with a full width at half maximum of between 15 ns to 200 ns; and
a laser amplifier including a second laser active medium including a mixed gas containing carbon dioxide gas through which the pulsed laser light emitted from the laser oscillator passes to be shortened to pulsed laser light with a full width at half maximum of between 5 ns and 30 ns to be output, wherein
a value obtained by dividing a rise time that is a time from when intensity of the pulsed laser light output from the laser oscillator rises to 10% of a maximum intensity to when the intensity rises to 90% of the maximum intensity by the full width at half maximum of the pulsed laser light output from the laser oscillator is smaller than 0.72.

2. The laser amplification device according to claim 1, further comprising:
at least one polarization beam splitter including a first polarization beam splitter installed in an optical path of the pulsed laser light between the laser oscillator and the laser amplifier; and
an electro-optic device installed in the optical path of the pulsed laser light between the first polarization beam splitter and the laser oscillator to perform 90 degree polarization control to allow only part of the pulsed laser light input to pass through the first polarization beam splitter.

3. The laser amplification device according to claim 2, wherein the electro-optic device performs the 90 degree polarization control to allow pulse width shaping in which a first half portion and a latter half portion of the input pulsed laser light are reflected by the first polarization beam splitter and only a central portion is transmitted.

4. The laser amplification device according to claim 1, wherein the mixed gas has a gas pressure of between 20 Torr and 100 Torr.

5. The laser amplification device according to claim 1, wherein the laser amplifier includes two or more paths that are optical paths from when the pulsed laser light enters the second laser active medium to when the pulsed laser light exits.

6. The laser amplification device according to claim 1, further comprising:
a data acquisition circuitry to acquire a first signal indicating a time-series waveform of intensity of the pulsed laser light input to the laser amplifier and a second signal indicating a time-series waveform of intensity of the pulsed laser light output from the laser amplifier;
a learning circuitry to execute learning for estimating a time-series waveform of intensity of the pulsed laser light output when the first signal is input to the laser amplifier, based on the first signal and the second signal; and
an estimation circuitry to estimate a time-series signal of intensity of the pulsed laser light output when the first signal is input to the laser amplifier, based on a result of the learning by the learning circuitry.

7. An extreme ultraviolet light generation apparatus comprising:
the laser amplification device according to claim 1; and
an extreme ultraviolet light generator to irradiate a target with the pulsed laser light output from the laser amplification device to generate extreme ultraviolet light.

* * * * *